United States Patent
Omura et al.

(10) Patent No.: US 8,102,508 B2
(45) Date of Patent: Jan. 24, 2012

(54) PROJECTION OPTICAL SYSTEM, EXPOSURE APPARATUS, AND EXPOSURE METHOD

(75) Inventors: Yasuhiro Omura, Kounosu (JP); Soichi Owa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 781 days.

(21) Appl. No.: 11/658,918

(22) PCT Filed: Jul. 22, 2005

(86) PCT No.: PCT/JP2005/013447
§ 371 (c)(1),
(2), (4) Date: Dec. 11, 2007

(87) PCT Pub. No.: WO2006/013734
PCT Pub. Date: Feb. 9, 2006

(65) Prior Publication Data
US 2008/0165336 A1 Jul. 10, 2008

(30) Foreign Application Priority Data

Aug. 3, 2004 (JP) .................................. 2004-227226
Sep. 14, 2004 (JP) .................................. 2004-267319
May 10, 2005 (JP) .................................. 2005-136902

(51) Int. Cl.
*G03B 27/52* (2006.01)
(52) U.S. Cl. ........................................ 355/55; 355/30
(58) Field of Classification Search .................... 355/53, 355/30, 71, 55
See application file for complete search history.

(56) References Cited

U.S. PATENT DOCUMENTS

| 5,194,893 | A | 3/1993 | Nishi |
| 6,195,154 | B1 | 2/2001 | Imai |
| 7,557,997 | B2 * | 7/2009 | Omura et al. ................. 359/649 |
| 2002/0054231 | A1 | 5/2002 | Masuyuki |
| 2003/0011755 | A1 * | 1/2003 | Omura et al. .................. 355/67 |
| 2003/0053036 | A1 | 3/2003 | Fujishima et al. |
| 2003/0090786 | A1 | 5/2003 | Suenaga et al. |

(Continued)

FOREIGN PATENT DOCUMENTS
JP A 06-53120 2/1994
(Continued)

OTHER PUBLICATIONS

International Preliminary Report on Patentability, mailed Feb. 15, 2007, Intl Appl. No. PCT/JP2005/013447, filed Jul. 22, 2005.

(Continued)

*Primary Examiner* — Peter B Kim
(74) *Attorney, Agent, or Firm* — Oliff & Berridge, PLC

(57) ABSTRACT

An imaging optical system that has liquid interposed in an optical path to the image plane to achieve a large effective image-side numerical aperture larger than, for example, 1.4, while a relatively large effective imaging region can be achieved. The imaging optical system that projects an image of a first surface onto a second surface. The optical path between the projection optical system and the second surface can be filled with liquid with a refractive index larger than 1.5, where a refractive index of gas in an optical path within the imaging optical system is 1. The imaging optical system comprises a boundary lens that can be contacted with the gas on the side of the first surface and that can be contacted with the liquid on the side of the second surface, and the boundary lens has a positive refracting power and is made of an optical material having a refractive index larger than 1.8.

47 Claims, 10 Drawing Sheets

U.S. PATENT DOCUMENTS

| | | | |
|---|---|---|---|
| 2003/0147061 A1* | 8/2003 | Omura | 355/67 |
| 2004/0004771 A1 | 1/2004 | Omura | |
| 2004/0032575 A1 | 2/2004 | Nishi et al. | |
| 2004/0042213 A1 | 3/2004 | Kimura et al. | |
| 2004/0169834 A1* | 9/2004 | Richter et al. | 355/67 |
| 2005/0254033 A1 | 11/2005 | Toyoda | |

FOREIGN PATENT DOCUMENTS

| | | |
|---|---|---|
| JP | A H6-124873 | 5/1994 |
| JP | A 06-188169 | 7/1994 |
| JP | A 10-303114 | 11/1998 |
| JP | A 2000-133588 | 5/2000 |
| JP | A 2003-318098 | 11/2003 |
| JP | A 2004-053778 | 2/2004 |
| JP | A 2004-062149 | 2/2004 |
| JP | A 2004-205698 | 7/2004 |
| WO | WO 98/28665 A1 | 7/1998 |
| WO | WO 99/49504 A1 | 9/1999 |
| WO | WO 01/23935 A1 | 4/2001 |
| WO | WO 03/007045 A1 | 1/2003 |
| WO | WO 2004/019128 A2 | 3/2004 |
| WO | WO 2007/071569 A1 | 6/2007 |

OTHER PUBLICATIONS

Burnett et al., "High Index Materials for 193 nm and 157 nm Immersion Lithography," International Symposium on Immersion & 157 nm Lithography, 2004, XP001207229.

Smith et al., "Approaching the numerical aperture of water—Immersion lithography at 193nm," Proceedings of SPIE, 2004, vol. 5377, pp. 273-284, XP002503314.

Apr. 6, 2009 Notice of Allowance in U.S. Appl. No. 11/889,180.

Jan. 24, 2011 Request for *Inter Partes* Reexamination for U.S. Patent No. 7,557,997.

Dec. 23, 2005 Provisional Application No. 60/753,789, with translation.

Feb. 22, 2011 Decision Granting *Inter Partes* Reexamination in Reexamination Control No. 95/001,527.

Feb. 22, 2011 Office Action in Reexamination Control No. 95/001,527.

Mar. 23, 2011 Reason for Refusal in JP-05-00683 (with English translation).

Jul. 19, 2011 Notice of Decision of Rejection in JP-05-00683 (with English translation).

* cited by examiner

PROJECTION OPTICAL SYSTEM, EXPOSURE APPARATUS, AND EXPOSURE METHOD

CROSS-REFERENCE TO RELATED APPLICATIONS

This application is based upon and claims the benefit of priorities from International Application No. PCT/JP2005/013447 filed on Jul. 22, 2005, and Japanese Patent Application Nos. 2004-227226 filed on Aug. 3, 2004, 2004-267319 filed on Sep. 14, 2004, and 2005-136902 filed on May 10, 2005, the entire contents of which are incorporated herein by reference.

BACKGROUND

1. Field

One embodiment of the present invention relates to a projection optical system, exposure apparatus, and exposure method, particularly to a projection optical system suitable for an exposure apparatus used in manufacturing micro-devices such as a semiconductor device and a liquid crystal display device, for example, in a photolithography process.

2. Description of the Related Art

In a photolithography process for manufacturing a semiconductor device and the like, an exposure apparatus has been used, which projects a pattern image of a mask (or reticle) onto a photosensitive substrate (a wafer, glass plate and the like, on which photoresist is applied) to effect exposure thereof through a projection optical system. As the integration density of semiconductor devices increases, the resolving power (or resolution) required in the projection optical system is more and more increased in the exposure apparatus.

Therefore, in order to meet the requirement on the resolving power of a projection optical system, it is necessary to make wavelength $\lambda$ of illuminating light (or exposure light) shorter and to increase the numerical aperture NA on the image side of the projection optical system. Specifically, the resolution of a projection optical system is represented as $k \cdot \lambda / NA$ (where k is a process coefficient). In addition, the image-side numerical aperture NA is represented as $n \cdot \sin \theta$ where n is the refractive index of a medium (typically gas such as air) between the projection optical system and a photosensitive substrate, and $\theta$ is the maximum angle of incidence onto the photosensitive substrate.

In this case, an attempt to increase the image-side numerical aperture by increasing the maximum angle of incidence $\theta$ results in an increased angle of incidence onto the photosensitive substrate and an increased angle of emergence from the projection optical system; this increases reflection losses on an optical plane, and therefore, a large effective image-side numerical aperture cannot be achieved. Therefore, an immersion technique has been proposed in International Publication WO2004/019128, which increases in the image-side numerical aperture by filling an optical path between a projection optical system and a photosensitive substrate with a medium such as liquid having a high refractive index.

SUMMARY

A first embodiment of the present invention provides a projection optical system that projects a reduced image of a first surface onto a second surface, characterized in that an optical path between said projection optical system and said second surface can be filled with liquid having a refractive index larger than 1.5, where a refractive index of gas in an optical path within said projection optical system is 1, said projection optical system comprising a boundary lens that can be contacted with said gas on the side of said first surface and contacted with said liquid on the side of said second surface, and in that said boundary lens has a positive refracting power (positive power) and is made of an optical material having a refractive index larger than 1.8.

There is provided in a second aspect of the invention a projection optical system that projects an image of an object onto a substrate, characterized by comprising a first optical element disposed on the extremity of image-plane side and made of at least one material of CaO and MgO.

There is provided in a third aspect of the invention a projection optical system that projects an image of an object onto a substrate, characterized in that the projection optical system comprises a first optical element disposed on the extremity of image-plane side and a second optical element disposed adjacent to the first optical element on the side of said object, and in that at least one of said first optical element and said second optical element is made of at least one material of CaO and MgO.

There is provided in a fourth aspect of the invention a projection optical system that projects an image of an object onto a substrate, characterized in that the projection optical system comprises a first optical element disposed on the extremity of image-plane side and a second optical element disposed adjacent to the first optical element on the side of said object, and in that said first optical element is made of CaO or MgO, and said second optical element is made of MgO or CaO.

There is provided in a fifth aspect of the invention a projection optical system that projects an image of an object onto a substrate, characterized in that the projection optical system comprises a first optical element disposed on the extremity of image-plane side, a second optical element disposed adjacent to the first optical element on the side of said object, and a third optical element disposed adjacent to the second optical element on the side of said object, and in that said first to third optical elements are an optical element made of CaO, an optical element made of MgO, and an optical element made of silica glass, respectively, and thickness of said optical element made of the CaO along an optical axis and thickness of said optical element made of the MgO along the optical axis are designed so as to reduce an effect of intrinsic birefringence retained by said CaO and said MgO.

There is provided in a sixth aspect of the invention a projection optical system that projects an image of an object onto a substrate, characterized in that the projection optical system comprises an optical element made of CaO, and in that the optical element made of the CaO is provided with a coating containing MgO.

There is provided in a seventh aspect of the invention a projection optical system that projects an image of an object onto a substrate, characterized in that the projection optical system comprises an optical element made of MgO, and in that the optical element made of the MgO is provided with a coating containing CaO.

There is provided in an eighth aspect of the invention a projection optical system that projects an image of an object onto a substrate, characterized by comprising a first optical element disposed on the extremity of image-plane side and made of at least one material from a crystalline material group consisting of CaO, a crystalline material containing CaO, MgO, and a crystalline material containing MgO.

There is provided in a ninth aspect of the invention a projection optical system that projects an image of an object onto a substrate, characterized in that the projection optical system comprises a first optical element disposed on the extremity of image-plane side and a second optical element disposed adjacent to the first optical element on the side of said object, and in that at least one of said first optical element and said second optical element is made of a material selected from at least one crystalline material group of a first crystalline material group consisting of CaO and a crystalline material containing CaO and a second crystalline material group consisting of MgO and a crystalline material containing MgO.

There is provided in a tenth aspect of the invention a projection optical system that projects an image of an object onto a substrate, characterized in that the projection optical system comprises a first optical element disposed on the extremity of image-plane side and a second optical element disposed adjacent to the first optical element on the side of said object, and in that said first optical element is made of a first material selected from a first crystalline material group consisting of CaO and a crystalline material containing CaO or a second material selected from a second crystalline material group consisting of MgO and a crystalline material containing MgO, and said second optical element is made of a second material selected from said second crystalline material group or a first material selected from said first crystalline material group.

There is provided in an eleventh aspect of the invention a projection optical system that projects an image of an object onto a substrate, characterized in that the projection optical system comprises a first optical element disposed on the extremity of image-plane side, a second optical element disposed adjacent to the first optical element on the side of said object, and a third optical element disposed adjacent to the second optical element on the side of said object, and in that said first to third optical elements are an optical element made of a first material selected from a first crystalline material group consisting of CaO and a crystalline material containing CaO, an optical element made of a second material selected from a second crystalline material group consisting of MgO and a crystalline material containing MgO, and an optical element made of silica glass, respectively, and thickness of the optical element made of said first material selected from said first crystalline material group along an optical axis and thickness of the optical element made of said second material selected from said second crystalline material group along the optical axis are designed so as to reduce an effect of intrinsic birefringence retained by said first material selected from said first crystalline material group and said second material selected from said second crystalline material group.

There is provided in a twelfth aspect of the invention a projection optical system that projects an image of an object onto a substrate, characterized in that the projection optical system comprises an optical element made of a first material selected from a first crystalline material group consisting of CaO and a crystalline material containing CaO, and in that the optical element made of the first material is provided with a coating containing a second material selected from a second crystalline material group consisting of MgO and a crystalline material containing MgO.

There is provided in a thirteenth aspect of the invention a projection optical system that projects an image of an object onto a substrate, characterized in that the projection optical system comprises an optical element made of a second material selected from a second crystalline material group consisting of MgO and a crystalline material containing MgO, and in that the optical element made of the second material is provided with a coating containing a first material selected from a first crystalline material group consisting of CaO and a crystalline material containing CaO.

There is provided in a fourteenth aspect of the invention an imaging optical system with which a first surface is conjugated to a second surface, characterized in that an optical path between said imaging optical system and said second surface can be filled with liquid having a refractive index larger than 1.5, where a refractive index of gas in an optical path within said imaging optical system is 1, said imaging optical system comprising a boundary lens that can be contacted with said gas on the side of said first surface and contacted with said liquid on the side of said second surface, and in that said boundary lens has a positive refracting power and is made of an optical material having a refractive index larger than 1.7.

There is provided in a fifteenth aspect of the invention an exposure apparatus, characterized by comprising a projection optical system according to the first to thirteenth aspects, and exposing said substrate through liquid in an immersion region formed on the image-plane side of said projection optical system.

There is provided in a sixteenth aspect of the invention an exposure method, characterized in that a projection optical system according to the first to thirteenth aspects is used to expose said substrate through liquid in an immersion region formed on the image-plane side of said projection optical system.

There is provided in a seventeenth aspect of the invention a device manufacturing method, characterized in that the exposure apparatus according to the fifteenth aspect is used.

DETAILED DESCRIPTION OF EMBODIMENTS

Figure 1:
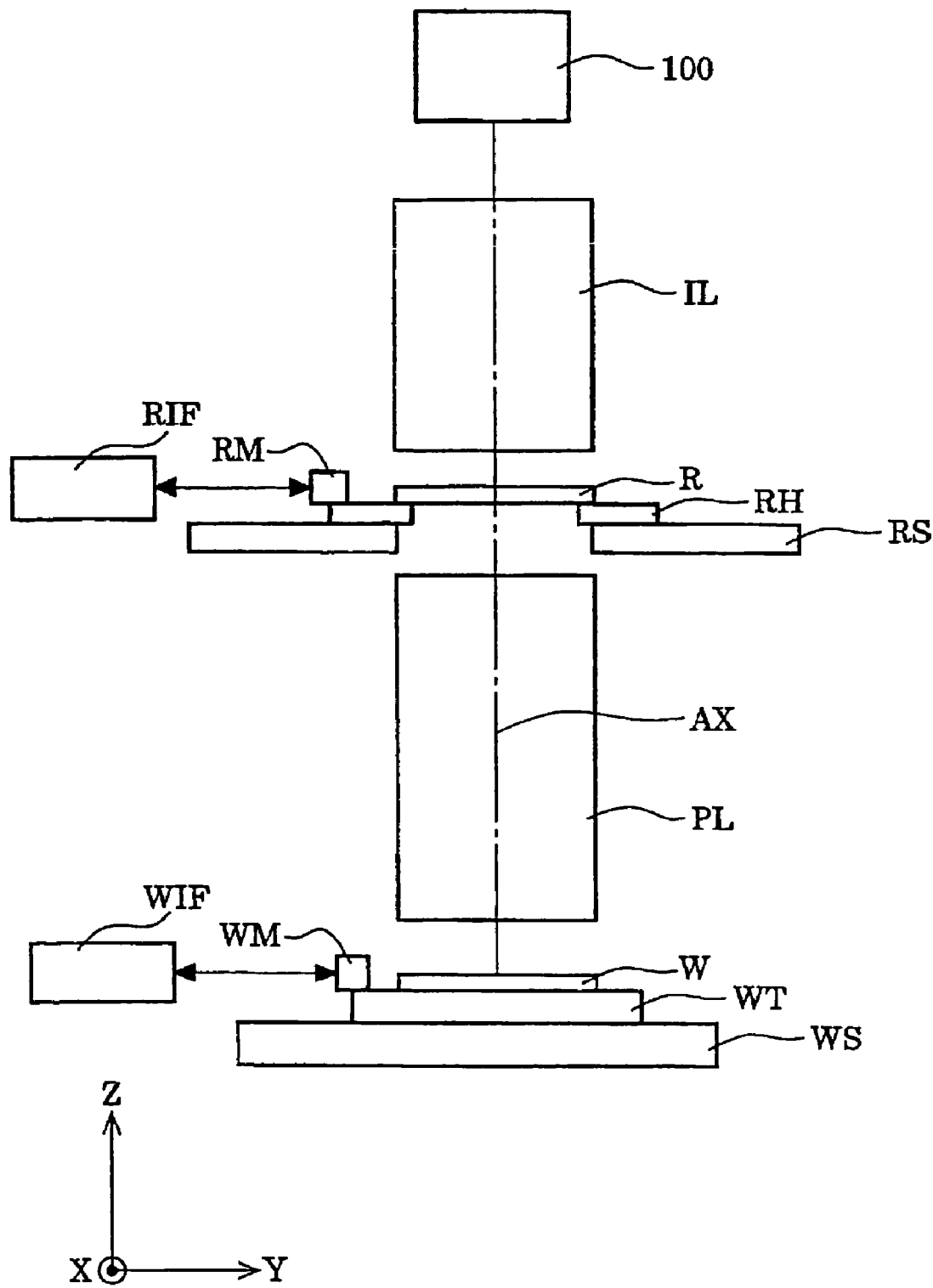
FIG. 1 schematically shows a configuration of an exposure apparatus according to an embodiment of the invention.

In a projection optical system according to the invention, liquid having a refractive index larger than 1.5 is interposed in an optical path between a boundary lens and the image plane (second surface) so as to achieve a large effective image-side numerical aperture (second surface-side numerical aperture) larger than, for example, 1.4. In this case, when only refractive index of liquid used as immersion liquid is increased simply, a curvature of a convex surface of a boundary lens on the object side (first surface side) would be excessively large so that the lens design is precluded, and a sufficiently large effective imaging region (either an effective static exposed region in the case of an exposure apparatus, or an effective field region in the case where the second surface has the object plane) cannot be achieved on the image plane (on the second surface).

Therefore, in the present invention, the boundary lens is made of an optical material having a refractive index larger than 1.8 in association with the high refractive index of the liquid in contact with the surface of the boundary lens on the image side (second surface side). As a result, a projection optical system according to the present invention has liquid interposed in an optical path to the image plane (second surface) to achieve a large effective image-side numerical aperture (second surface-side numerical aperture) larger than, for example, 1.4, while a relatively large effective imaging region (or effective field region) can be secured. In addition, with an exposure apparatus and exposure method according to the invention, a fine pattern can be accurately projected to effect exposure through a high resolution projection optical system having an image-side numerical aperture (second surface-side numerical aperture) larger than, for example, 1.4, while a relatively large effective imaging region (or effective region of field) is secured.

Incidentally, in the present invention, it is preferable that the following conditional inequality (1) is satisfied. In the conditional inequality (1), Fb is a focal length of the boundary lens, Yi is either the maximum height on the image plane in the case where the second surface is the image plane or the maximum height on the object plane in the case where the second surface is the object plane.

$$0.11 < Yi/Fb < 0.15 \quad (1)$$

It is not preferable to fall below the lower limit of the conditional inequality (1) because the focal length Fb of the boundary lens becomes excessively large so that it would be difficult to achieve a required large image-side numerical aperture. On the other hand, it is not preferable to exceed the upper limit of the conditional inequality (1) because the focal length Fb of the boundary lens becomes excessively small so that it would be difficult to properly correct aberrations over a required image region. In order to achieve an even larger image-side numerical aperture, it is preferable to set 0.115 as the lower limit of the conditional inequality (1). Additionally, in order to properly correct aberrations over a required image region, it is preferable to set 0.14 as the upper limit. This conditional inequality (1) may be applied not only to a thrice-imaging type catadioptric system having one concave reflecting mirror and two optical path folding mirrors, such as an embodiment as described below, but also to a catadioptric system having multiple concave reflecting mirrors and one linear optical axis and a dioptric system. That is, the benefit is obtained whenever the boundary lens satisfies the conditional inequality (1), regardless of whatever configurations the optical system has on the side of incidence of the boundary lens, where a boundary lens having such a large refractive index may be applied.

In the present invention, magnesium oxide (MgO), for example, may be used for an optical material forming a boundary lens (i.e. an optical material having refractive index larger than 1.8). The refractive index of magnesium oxide is on the order of 2.1 with respect to ArF excimer laser beam (wavelength λ=193.3 nm). Magnesium oxide is a crystalline material belonging to a cubic system and has intrinsic birefringence. On the other hand, although calcium oxide (CaO) is also a crystalline material belonging to a cubic system and has intrinsic birefringence, calcium oxide has the amount of birefringence with an opposite sign to magnesium oxide.

Therefore, when a boundary lens is made of magnesium oxide, it is preferable to have at least one optically transparent member made of calcium oxide so that an effect of intrinsic birefringence of magnesium oxide can be reduced with a cancelling effect. The amount of birefringence of calcium oxide, however, is known to be substantially large as compared with that of magnesium oxide. Therefore, in a projection optical system having a reducing magnification as in the present invention, it is preferable to dispose an optically transparent member made of calcium oxide at a location where an angular range of incidence of light is relatively small and shows satisfactory telecentricity is shown, in order to suppress an effect of intrinsic birefringence of calcium oxide. Specifically, starting sequentially from the object plane (first surface), the first to third optically transparent members along a path of traveling light preferably include an optically transparent member made of calcium oxide.

In the present invention, calcium oxide may also be used for an optical material forming a boundary lens. The refractive index of calcium oxide is on the order of 2.7 with respect to ArF excimer laser beam (wavelength λ=193.3 nm). In this case, it is preferable to have at least one optically transparent member made of magnesium oxide so that an effect of intrinsic birefringence of calcium oxide forming the boundary lens can be reduced with a cancelling effect.

In the present invention, starting sequentially from the image plane (second surface), the first to third optically transparent members along a path of traveling light preferably include at least one optically transparent member made of magnesium oxide and at least one optically transparent member made of calcium oxide, and satisfy the following conditional inequality (2). In the conditional inequality (2), TM is the sum of center thickness of the at least one optically transparent member made of magnesium oxide, and TC is the sum of center thickness of at least one optically transparent member made of calcium oxide.

$$0.05 < TC/TM < 0.43 \quad (2)$$

It is not preferable to fall below the lower limit of the conditional inequality (2) because the sum of center thickness (axial thickness) of optically transparent members made of magnesium oxide (or the center thickness of an optically transparent member when there is only one member) TM becomes excessively large so that a relatively large effect of intrinsic birefringence of magnesium oxide would remain. On the other hand, it is not preferable to exceed the upper limit of the conditional inequality (2) because the sum of center thickness of optically transparent members made of calcium oxide (or the center thickness of an optically transparent member when there is only one member) TC becomes excessively large so that a relatively large effect of intrinsic birefringence of calcium oxide would remain. In order to have an even better effect of the invention, it is preferable to set 0.08 as the lower limit and 0.4 as the upper limit of the conditional inequality (2).

When the first to third optically transparent members starting sequentially from the image plane include optically transparent members made of magnesium oxide and optically transparent members made of calcium oxide, one of the optically transparent members made of magnesium oxide and one of the optically transparent members made of calcium oxide are preferably bonded to each other by an approach such as optical contact (optical welding) to constitute a united lens. The optical contact is a technique for bonding two optical members by an intermolecular attractive force without any adhesive by accurately machining surfaces of the two optical members into complementary shapes and adjoining these surfaces. Because the amount of birefringence of calcium oxide is larger than that of magnesium oxide as described above, an optical member made of calcium oxide is likely to be relatively thin, which often makes it difficult to hold the member. Use of a form of united lens, however, facilitates holding of the relatively thin optically transparent member made of calcium oxide integrally with a relatively thick optically transparent member made of magnesium oxide.

In the present invention, a crystalline material represented as $Mg_xCa_{1-x}O$ (0.8<x<0.9) may also be used for an optical material forming a boundary lens. The crystalline material represented as $Mg_xCa_{1-x}O$ can achieve a refractive index larger than 1.8 with respect to light used and reduce its intrinsic birefringence to a small level by setting a value larger than 0.8 and smaller than 0.9 as x.

Embodiments according to the present invention will now be described with reference to the attached drawings. FIG. 1 schematically shows a configuration of an exposure apparatus according to an embodiment of the invention. In FIG. 1, a Z axis is defined in parallel with a reference optical axis AX of a projection optical system PL, a Y axis is defined in a plane perpendicular to the reference optical axis AX and in parallel with the page of FIG. 1, and an X axis is defined in a plane perpendicular to the reference optical axis AX and perpendicularly to the page of FIG. 1.

The exposure apparatus shown in the figure is provided with an ArF excimer laser source as a light source 100 for providing illuminating light (exposure light). The light emitted from the light source 100 illuminates a reticle R, on which a predetermined pattern is formed, in a superposed manner through an illumination optical system IL. The optical path between the light source 100 and the illumination optical system IL is enclosed by a casing (not shown), and in the space from the light source 100 to the optical member nearest to the reticle in the illumination optical system IL, inert gas such as helium gas or nitrogen, which has a low absorptivity for the exposure light, is substituted for, or a substantially vacuum state is maintained.

The reticle R is retained through a reticle holder RH on a reticle stage RS in parallel with a XY plane. A pattern to be transferred has been formed on the reticle R, and illumination is provided in a rectangular (or slit-shaped) pattern region having long sides along the X direction and short sides along the Y direction within the whole pattern region. The reticle stage RS can be actuated by a driving system which is omitted in the figure, and two-dimensionally moved along a reticle plane (i.e. XY plane). The stage uses an interferometer RIF using a reticle moving mirror RM to measure the position coordinates and be controlled in its position.

Light through the pattern formed on the reticle R forms a reticle pattern image on a wafer W, which is a photosensitive substrate, through the catadioptric projection optical system PL. The wafer W is retained through a wafer table (wafer holder) WT on a wafer stage WS in parallel with the XY plane. The pattern image is formed on the wafer W in a rectangular static exposed region (i.e. effective exposed region: effective imaging region of the projection optical system PL) having long sides along the X direction and short sides along the Y direction, so that the region optically cor- responds to the rectangular illuminated region on the reticle R. The wafer stage WS can be actuated by a driving system which is omitted in the figure, and two-dimensionally moved along a wafer plane (i.e. XY plane). The stage uses an interferometer WIF using a wafer moving mirror WM to measure the position coordinates and be controlled in its position.

Figure 2:
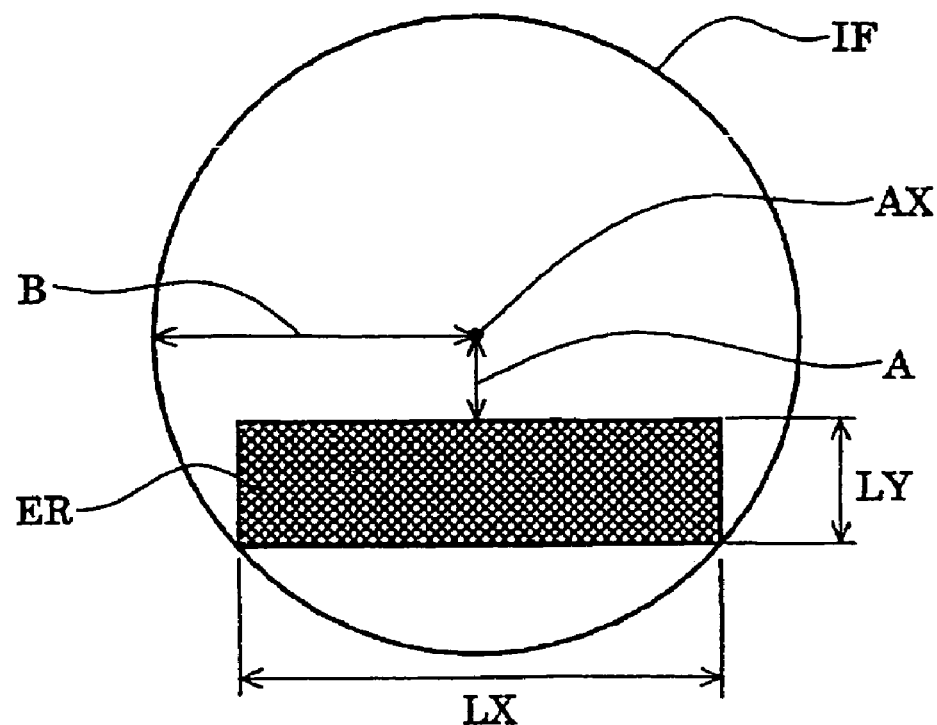
FIG. 2 shows a positional relationship between a rectangular static exposed region (i.e. effective exposed region) formed on a wafer and a reference optical axis.
Figure 2:
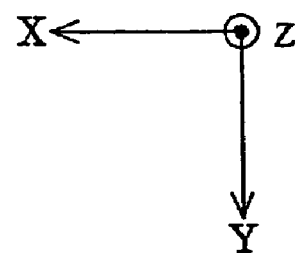

FIG. 2 shows a positional relationship between a rectangular static exposed region (i.e. effective exposed region) formed on a wafer and a reference optical axis. In examples of the embodiment, a rectangular effective exposed region ER is configured as shown in FIG. 2, which has a desired size in a position displaced by an off-axis distance A in the Y direction apart from the reference optical axis AX within a circular region (image circle) when that has a radius B and is centered around the reference optical axis AX.

Here, the length of the effective exposed region in the X direction is denoted as LX, and the length in the Y direction as LY. Therefore, although omitted in the figure, a rectangular illuminated region (i.e. effective illuminated region) should be formed on the reticle R in association with the rectangular effective exposed region ER, and the illuminated region has a size and shape corresponding to the effective exposed region ER in a position displaced by a distance corresponding to the off-axis distance A in the Y direction apart from the reference optical axis AX.

In the exposure apparatus according to the embodiment, the inside of the projection optical system PL is kept airtight between the optical member disposed nearest to the reticle (plane-parallel plate P1 in examples) and a boundary lens Lb among optical members constituting the projection optical system PL, and the inside of the projection optical system PL has inert gas such as helium gas or nitrogen substituted for gas therein or is maintained in a substantially vacuum state. In addition, in a narrow optical path between the illumination optical system IL and the projection optical system PL, where the reticle R, the reticle stage RS and the like are disposed, the inside of a casing (not shown) enclosing the reticle R, the reticle stage RS and the like is filled with inert gas such as nitrogen or helium gas or is maintained in a substantially vacuum state.

Figure 3:
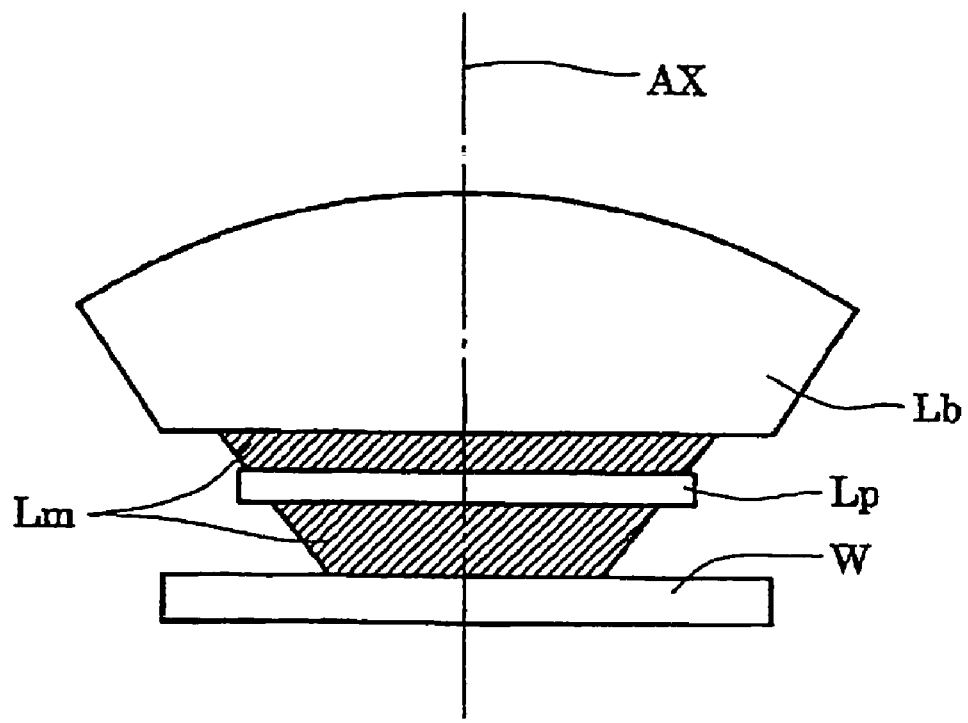
FIG. 3 schematically shows a configuration between a boundary lens and a wafer in examples of the embodiment.

FIG. 3 schematically shows a configuration between a boundary lens and a wafer in examples of the embodiment. Referring to FIG. 3, the boundary lens Lb has positive refracting power and its convex surface faces the reticle side. In addition, a plane-parallel plate Lp is insertably and removably disposed in an optical path between the boundary lens Lb and the wafer W, and optical paths between the boundary lens Lb and the plane-parallel plate Lp and between the plane-parallel plate Lp and the wafer W are filled with liquid (medium) Lm having a refractive index larger than 1.5.

In this way, an atmosphere in which little exposure light may be absorbed is formed over an optical path from the light source 100 to the wafer W. As described above, the illuminated region on the reticle R and the static exposed region (i.e. effective exposed region) ER on the wafer W have a rectangular shape oblong in the X direction. Therefore, when driving systems and interferometers (RIF, WIF) are used to control the reticle R and wafer W in their positions, while the reticle stage RS and wafer stage WS, namely the reticle R and wafer W, synchronously moved (scanned) along the Y direction, a reticle pattern is scanned and exposed on the wafer W in a shot region (exposed region) that has a width equal to an X direction length LX of the effective exposed region ER and a length corresponding to the scan amount (movement amount) of the wafer W.

Incidentally, in order to keep the optical path between the boundary lens Lb of the projection optical system PL and the wafer W filled with the liquid Lm from the start to the end of the scanning and exposure in a step-and-scan exposure apparatus that accomplishes scanning and exposure while the wafer W is being moved relative to the projection optical system PL, techniques disclosed in International Publication WO99/49504 and Japanese Patent Laid-Open No. Hei 10-303114 may be used.

In the technique disclosed in International Publication WO99/49504, liquid conditioned to a predetermined temperature is supplied from a liquid supply apparatus through a supply pipe and a discharge nozzle so that the optical path between the boundary lens Lb and the wafer W is filled, and collected by the liquid supply apparatus through a collection pipe and an entrance nozzle from on the wafer. On the other hand, the technique disclosed in Japanese Patent Laid-Open No. Hei 10-303114, a wafer holder table is formed into a shape of vessel so that liquid can be contained, and the wafer W is positioned and retained by vacuum contact (in the liquid) at the center of the inner bottom thereof. Additionally, the tip of the projection optical system PL, and therefore an optical plane on the wafer side of the boundary lens Lb, comes into the liquid.

In examples of the embodiment, an aspherical surface is represented by the following equation (a), where height in the direction perpendicular to an optical axis is y, the distance (amount of sag) along the optical axis from a plane in contact with the vertex of the aspherical surface to a position on the aspherical surface at the height y is z, the radius of curvature of the vertex is r, the constant of the cone is κ, and the n-th order coefficient of aspherical surface is $C_n$. In examples, a lens surface shaped into an aspherical surface is denoted by a symbol "*" to the right of the surface number.

$$z=(y^2/r)/[1+\{1-(1+\kappa)\cdot y^2/r^2\}^{1/2}]+C_4\cdot y^4+C_6\cdot y^6+C_8\cdot y^8+C_{10}\cdot y^{10}+C_{12}\cdot y^{12}+C_{14}\cdot y^{14}+ \quad (a)$$

In addition, in examples of the embodiment, the projection optical system PL is provided with a first imaging optical system G1 for forming a first intermediate image of the pattern of the reticle R disposed at the object plane (first surface), a second imaging optical system G2 for forming a second intermediate image (an image of the first intermediate image, or a secondary image of the reticle pattern) of the reticle pattern based on light from the first intermediate image, and a third imaging optical system G3 for forming a final image of the reticle pattern (reduced image of reticle pattern) onto the wafer W disposed at the image plane (second surface) based on light from the second intermediate image. Here, both the first imaging optical system G1 and the third imaging optical system G3 are a dioptric system, and the second imaging optical system G2 is a catadioptric system that includes a concave reflecting mirror CM.

In addition, a first flat reflecting mirror (first folding mirror) M1 is disposed in an optical path between the first imaging optical system G1 and the second imaging optical system G2, and a second flat reflecting mirror (second folding mirror) M2 is disposed in an optical path between the second imaging optical system G2 and the third imaging optical system G3. In this way, in the projection optical system PL of the examples, light from the reticle R forms the first intermediate image of the reticle pattern near the first flat reflecting mirror M1 through the first imaging optical system G1. The light from the first intermediate image then forms the second intermediate image of the reticle pattern near the second flat reflecting mirror M2 through the second imaging optical system G2. The light from the second intermediate image further forms the final image of the reticle pattern onto the wafer W through the third imaging optical system G3.

In addition, in the projection optical system PL of the examples, the first imaging optical system G1 and the third imaging optical system G3 have optical axes AX1 and AX3 linearly extending along the vertical direction, and the optical axes AX1 and AX3 coincide with the reference optical axis AX. On the other hand, the second imaging optical system G2 has an optical axis AX2 (perpendicular to the reference optical axis AX) linearly extending along a horizontal direction. In this way, the reticle R, the wafer W, all optical members constituting the first imaging optical system G1, and all optical members constituting the third imaging optical system G3 are disposed in parallel with each other along a plane orthogonal to the direction of gravity, or a horizontal plane. In addition, each of the first flat reflecting mirror M1 and the second flat reflecting mirror M2 has a reflecting surface angled at 45 degrees relative to the reticle surface, and the first flat reflecting mirror M1 and the second flat reflecting mirror M2 are integrally constructed as a single optical member. Additionally, in examples, the projection optical system PL has a telecentric configuration with respect to both the object and image sides.

First Example

Figure 4:
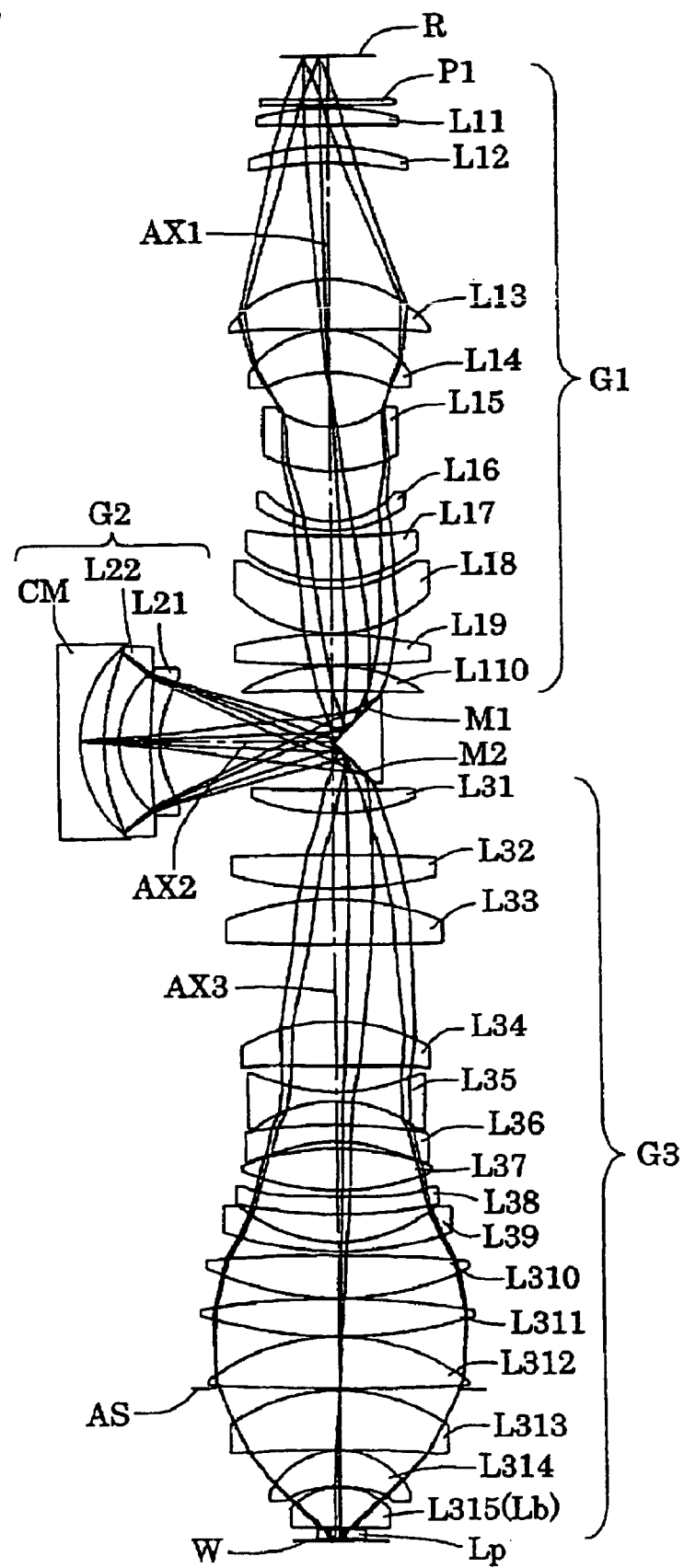
FIG. 4 shows a lens configuration of a projection optical system according to a first example of the embodiment.

FIG. 4 is a diagram that shows the lens configuration of a projection optical system related to the first example of this embodiment. Referring to FIG. 4, a first imaging optical system G1 in the projection optical system PL related to the first example composes, in order from the reticle side, a plane-parallel plate P1, a positive meniscus lens L11 whose convex surface facing the reticle side, a positive meniscus lens L12 whose convex surface facing the reticle side, a positive meniscus lens L13 whose aspherical surface facing the wafer side, a positive meniscus lens L14 whose convex surface facing the reticle side, a negative meniscus lens L15 whose concave surface facing the reticle side, a negative meniscus lens L16 whose concave surface facing the reticle side, a positive meniscus lens L17 whose aspherical-shaped concave surface facing the reticle side, a positive meniscus lens L18 whose concave surface facing the reticle side, a double-convex lens L19 whose an aspherical-shaped convex surface facing the wafer side, and a positive meniscus lens L110 whose an aspherical-shaped concave surface facing the wafer side.

A second imaging optical system G2 comprises, in order from the reticle side (i.e. the entrance side) along the forward optical travel path, a negative meniscus lens L21 whose aspherical-shaped concave surface an facing the reticle side, a negative meniscus lens L22 whose concave surface facing the reticle side, and a concave reflecting mirror CM whose concave surface facing the reticle side. A third imaging optical system G3 comprises, in order from the reticle side, a positive meniscus lens L31 whose concave surface facing the reticle side, a double-convex lens L32, a double-convex lens L33, a positive lens L34 whose aspherical surface facing the wafer side, a double-concave lens L35 whose aspherical-shaped concave surface facing the reticle side, a negative meniscus lens L36 whose aspherical-shaped concave surface facing the wafer side, a double-convex lens L37, a lens L38 whose aspherical surface facing the reticle side, a negative meniscus lens L39 whose aspherical-shaped concave surface facing the reticle side, a double-convex lens L310, a double-convex lens L311, a double-convex lens L312, an aperture stop AS, a positive meniscus lens L313 whose aspherical-shaped concave surface facing the wafer side, a positive meniscus lens L314 whose aspherical-shaped concave surface facing the wafer side, a plane-convex lens L315 whose plane facing the wafer side (a boundary lens Lb), and plane-parallel plate Lp.

In the first example, a liquid Lm having a refractive index of 1.64 with respect to an ArF excimer laser beam (wavelength $\lambda$=193.306 nm), which is the light to be used (the exposure light), is filled in an optical path between the boundary lens Lb and the plane-parallel plate Lp and an optical path between the plane-parallel plate Lp and the wafer W. It is possible to use glycerol ($CH_2[OH]CH[OH]CH_2[OH]$), heptane ($C_7H_{16}$) and the like as the liquid of this kind. In the first example, the plane-convex lens L315 as the boundary lens Lb is made of magnesium oxide (MgO) having a refractive index of 2.1 with respect to the light to be used, the plane-parallel plate Lp is made of calcium oxide (CaO) having a refractive index of 2.7 with respect to the light to be used, and other light-transmitting members are made of silica ($SiO_2$) having a refractive index of 1.5603261 with respect to the light to be used.

Table 1 below gives values of parameters of the projection optical system PL related to the first example. In Table 1, $\lambda$ denotes the center wavelength of the exposure light, $\beta$ the size of a projection magnification (imaging magnification of the whole system), NA the numerical aperture on the image side (the wafer side), B the radius of an image circle when on the wafer W, A the off-axis amount of an effective exposure region ER, LX the size of the effective exposure region ER along the X-direction (the size of the long side), and LY the size of the effective exposure region ER along the Y-direction (the size of the short side).

The surface Nos. denote the order of surfaces from the reticle side along the path of light rays that travel from the reticle surface as an object plane (the first surface) to the wafer surface as an image plane (the second surface), r denotes the radius of curvature of each surface (in the case of an aspherical surface, the radius of curvature at vertex: mm), d denotes the axial separation of each surface, i.e., the surface separation (mm), and n denotes the refractive index with respect to the center wavelength. Incidentally, the surface separation d changes its sign each time reflection occurs. Therefore, the signs of the surface separation d are negative in the optical path from the reflecting surface of a first plane reflecting mirror M1 to the concave reflecting mirror CM and in the optical path from a second plane reflecting mirror M2 to the image plane and are positive in other optical paths.

And in the first imaging optical system G1, the radii of curvature of the convexes toward the reticle side are positive, and the radii of curvature of the concaves toward the reticle side are negative. In the second imaging optical system G2, the radii of curvature of the concaves toward the entrance side (the reticle side) along the forward optical travel path and positive, and the radii of curvature of the convexes toward the entrance side are negative. In the third imaging optical system G3, the radii of curvature of the concaves toward the reticle side are positive, and the radii of curvature of the convexes toward the reticle side are negative. Incidentally, the notation of Table 1 applies to Table 2.

TABLE (1)

(Main parameters)

$\lambda$ = 193.306 nm
$\beta$ = ¼
NA = 1.5
B = 15.4 mm
A = 3 mm

TABLE (1)-continued

LX = 26 mm
LY = 5 mm (Parameters of optical members)

| Surface No. | r | d | n | Optical member |
|---|---|---|---|---|
| | (Reticle surface) | 56.505360 | | |
| 1 | ∞ | 8.000000 | 1.5603261 | (P1) |
| 2 | ∞ | 3.000000 | | |
| 3 | 332.11336 | 23.093116 | 1.5603261 | (L11) |
| 4 | 21941.06735 | 28.154649 | | |
| 5 | 332.11224 | 21.296182 | 1.5603261 | (L12) |
| 6 | 522.44465 | 153.940083 | | |
| 7 | 165.15684 | 67.515709 | 1.5603261 | (L13) |
| 8* | −100000.00000 | 1.239165 | | |
| 9 | 123.01479 | 57.000570 | 1.5603261 | (L14) |
| 10 | 178.35751 | 72.908214 | | |
| 11 | −111.70020 | 58.091111 | 1.5603261 | (L15) |
| 12 | −185.38994 | 67.381391 | | |
| 13 | −110.31593 | 12.000000 | 1.5603261 | (L16) |
| 14 | −164.47858 | 7.017118 | | |
| 15* | −2506.89396 | 60.000000 | 1.5603261 | (L17) |
| 16 | −178.26344 | 10.898723 | | |
| 17 | −181.03000 | 60.000000 | 1.5603261 | (L18) |
| 18 | −180.54715 | 1.193658 | | |
| 19 | 540.03108 | 39.864236 | 1.5603261 | (L19) |
| 20* | −1368.71929 | 1.000000 | | |
| 21 | 221.55125 | 32.784952 | 1.5603261 | (L110) |
| 22* | 3443.76334 | 69.000000 | | |
| 23 | ∞ | −224.625406 | | (M1) |
| 24* | 138.38475 | −12.500000 | 1.5603261 | (L21) |
| 25 | 838.03169 | −41.894757 | | |
| 26 | 122.79597 | −18.000000 | 1.5603261 | (L22) |
| 27 | 305.69094 | −32.611741 | | |
| 28 | 166.36416 | 32.611741 | | (CM) |
| 29 | 305.69094 | 18.000000 | 1.5603261 | (L22) |
| 30 | 122.79597 | 41.894757 | | |
| 31 | 838.03169 | 12.500000 | 1.5603261 | (L21) |
| 32* | 138.38475 | 224.625406 | | |
| 33 | ∞ | −64.048895 | | (M2) |
| 34 | 3037.95158 | −31.356823 | 1.5603261 | (L31) |
| 35 | 284.78296 | −55.563654 | | |
| 36 | −3232.21039 | −44.050510 | 1.5603261 | (L32) |
| 37 | 546.41895 | −14.472099 | | |
| 38 | −373.24330 | −60.000000 | 1.5603261 | (L33) |
| 39 | 4128.51422 | −102.814640 | | |
| 40 | −235.89294 | −60.000000 | 1.5603261 | (L34) |
| 41* | 2000.00000 | −34.617333 | | |
| 42* | 205.10801 | −12.000000 | 1.5603261 | (L35) |
| 43 | −175.46402 | −30.414779 | | |
| 44 | −663.82879 | −21.841705 | 1.5603261 | (L36) |
| 45* | −186.86524 | −9.073172 | | |
| 46 | −341.50340 | −54.412462 | 1.5603261 | (L37) |
| 47 | 327.31115 | −8.231048 | | |
| 48* | ∞ | −22.994923 | 1.5603261 | (L38) |
| 49 | 681.92829 | −37.021427 | | |
| 50* | 201.26070 | −12.243005 | 1.5603261 | (L39) |
| 51 | 467.77517 | −5.348484 | | |
| 52 | −1841.61164 | −57.556691 | 1.5603261 | (L310) |
| 53 | 391.71750 | −1.000000 | | |
| 54 | −1066.37400 | −48.185489 | 1.5603261 | (L311) |
| 55 | 634.92808 | −1.000000 | | |
| 56 | −286.21667 | −65.944769 | 1.5603261 | (L312) |
| 57 | 3644.46643 | −1.000000 | | |
| 58 | ∞ | −1.000000 | | (AS) |
| 59 | −244.44879 | −78.335946 | 1.5603261 | (L313) |
| 60* | −6072.75156 | −1.000000 | | |
| 61 | −103.38714 | −47.063379 | 1.5603261 | (L314) |
| 62* | −181.11841 | −1.000000 | | |
| 63 | −88.30984 | −52.565704 | 2.1 | (L315:Lb) |
| 64 | ∞ | −3.000000 | 1.64 | (Lm) |
| 65 | ∞ | −11.571429 | 2.7 | (Lp) |
| 66 | ∞ | −3.000000 | 1.64 | (Lm) |
| | (Wafer surface) | | | |

TABLE (1)-continued (Data of aspherical surfaces)

Surface #8

$\kappa = 0$
$C_4 = -1.58520 \times 10^{-9}$    $C_6 = 2.19792 \times 10^{-12}$
$C_8 = -1.08598 \times 10^{-16}$   $C_{10} = 1.16657 \times 10^{-22}$
$C_{12} = 3.05171 \times 10^{-25}$  $C_{14} = -1.41802 \times 10^{-29}$
$C_{16} = 2.13247 \times 10^{-34}$ Surface #15

$\kappa = 0$
$C_4 = -3.23042 \times 10^{-8}$    $C_6 = 1.44765 \times 10^{-13}$
$C_8 = -5.17111 \times 10^{-17}$   $C_{10} = 2.46719 \times 10^{-21}$
$C_{12} = -1.31638 \times 10^{-25}$ $C_{14} = 6.62583 \times 10^{-30}$
$C_{16} = -1.73316 \times 10^{-34}$ Surface #20

$\kappa = 0$
$C_4 = 8.69903 \times 10^{-9}$     $C_6 = -4.13871 \times 10^{-13}$
$C_8 = -2.61569 \times 10^{-19}$   $C_{10} = -5.26670 \times 10^{-22}$
$C_{12} = 4.74002 \times 10^{-26}$  $C_{14} = -1.67878 \times 10^{-30}$
$C_{16} = 2.55280 \times 10^{-35}$ Surface #22

$\kappa = 0$
$C_4 = -3.37303 \times 10^{-10}$   $C_6 = 5.84613 \times 10^{-13}$
$C_8 = -1.34897 \times 10^{-17}$   $C_{10} = 8.67441 \times 10^{-22}$
$C_{12} = -8.02773 \times 10^{-26}$ $C_{14} = 3.72367 \times 10^{-30}$
$C_{16} = -6.75336 \times 10^{-35}$ Surface #24 and surface #32 (the identical surface)

$\kappa = 0$
$C_4 = -9.33259 \times 10^{-8}$    $C_6 = -4.93088 \times 10^{-13}$
$C_8 = -1.23800 \times 10^{-16}$   $C_{10} = -7.97756 \times 10^{-21}$
$C_{12} = 5.17758 \times 10^{-24}$  $C_{14} = -7.83227 \times 10^{-28}$
$C_{16} = 5.04843 \times 10^{-32}$ Surface #41

$\kappa = 0$
$C_4 = -3.62270 \times 10^{-8}$    $C_6 = 1.11799 \times 10^{-12}$
$C_8 = -4.70237 \times 10^{-17}$   $C_{10} = 9.55647 \times 10^{-22}$
$C_{12} = -1.95001 \times 10^{-26}$ $C_{14} = -2.23863 \times 10^{-31}$
$C_{16} = 1.60578 \times 10^{-35}$ Surface #42

$\kappa = 0$
$C_4 = -5.79158 \times 10^{-8}$    $C_6 = 1.53532 \times 10^{-12}$
$C_8 = -1.55397 \times 10^{-16}$   $C_{10} = 9.29402 \times 10^{-21}$
$C_{12} = -3.21639 \times 10^{-25}$ $C_{14} = 5.30457 \times 10^{-30}$
$C_{16} = -1.52634 \times 10^{-35}$ Surface #45

$\kappa = 0$
$C_4 = 7.07396 \times 10^{-8}$     $C_6 = -4.48767 \times 10^{-13}$
$C_8 = 4.51716 \times 10^{-17}$    $C_{10} = -3.07038 \times 10^{-21}$
$C_{12} = 1.78922 \times 10^{-25}$  $C_{14} = -4.98907 \times 10^{-30}$
$C_{16} = -1.23423 \times 10^{-35}$ Surface #48

$\kappa = 0$
$C_4 = 4.07377 \times 10^{-8}$     $C_6 = 6.93833 \times 10^{-13}$
$C_8 = 3.73140 \times 10^{-17}$    $C_{10} = 7.13911 \times 10^{-22}$
$C_{12} = -8.82950 \times 10^{-26}$ $C_{14} = 7.79608 \times 10^{-30}$
$C_{16} = -4.19073 \times 10^{-34}$ Surface #50

$\kappa = 0$
$C_4 = 1.23943 \times 10^{-8}$     $C_6 = -6.49568 \times 10^{-13}$
$C_8 = 1.52799 \times 10^{-17}$    $C_{10} = -5.31249 \times 10^{-22}$
$C_{12} = -7.71608 \times 10^{-27}$ $C_{14} = -1.92564 \times 10^{-32}$
$C_{16} = 3.48432 \times 10^{-35}$ Surface #60

$\kappa = 0$
$C_4 = -2.74864 \times 10^{-8}$    $C_6 = 1.70444 \times 10^{-12}$
$C_8 = -8.65407 \times 10^{-17}$   $C_{10} = 3.89488 \times 10^{-22}$
$C_{12} = 4.18042 \times 10^{-26}$  $C_{14} = 1.17634 \times 10^{-29}$
$C_{16} = -1.41480 \times 10^{-33}$ $C_{18} = 6.18963 \times 10^{-38}$
$C_{20} = -1.05698 \times 10^{-42}$ TABLE (1)-continued Surface #62

$\kappa = 0$
$C_4 = -1.25568 \times 10^{-7}$    $C_6 = -1.56676 \times 10^{-11}$
$C_8 = 4.40757 \times 10^{-16}$    $C_{10} = -1.65332 \times 10^{-19}$
$C_{12} = -2.56855 \times 10^{-24}$ $C_{14} = -1.64472 \times 10^{-28}$
$C_{16} = -1.05509 \times 10^{-30}$ $C_{18} = 2.55094 \times 10^{-34}$
$C_{20} = -2.49917 \times 10^{-38}$ (Values corresponding to condition expressions)

Yi = 15.4 mm
Fb = 131.662 mm
TC = 11.571429 mm
TM = 52.565704 mm
(1) Yi/Fb = 0.117
(2) TC/TM = 0.220

Figure 5:
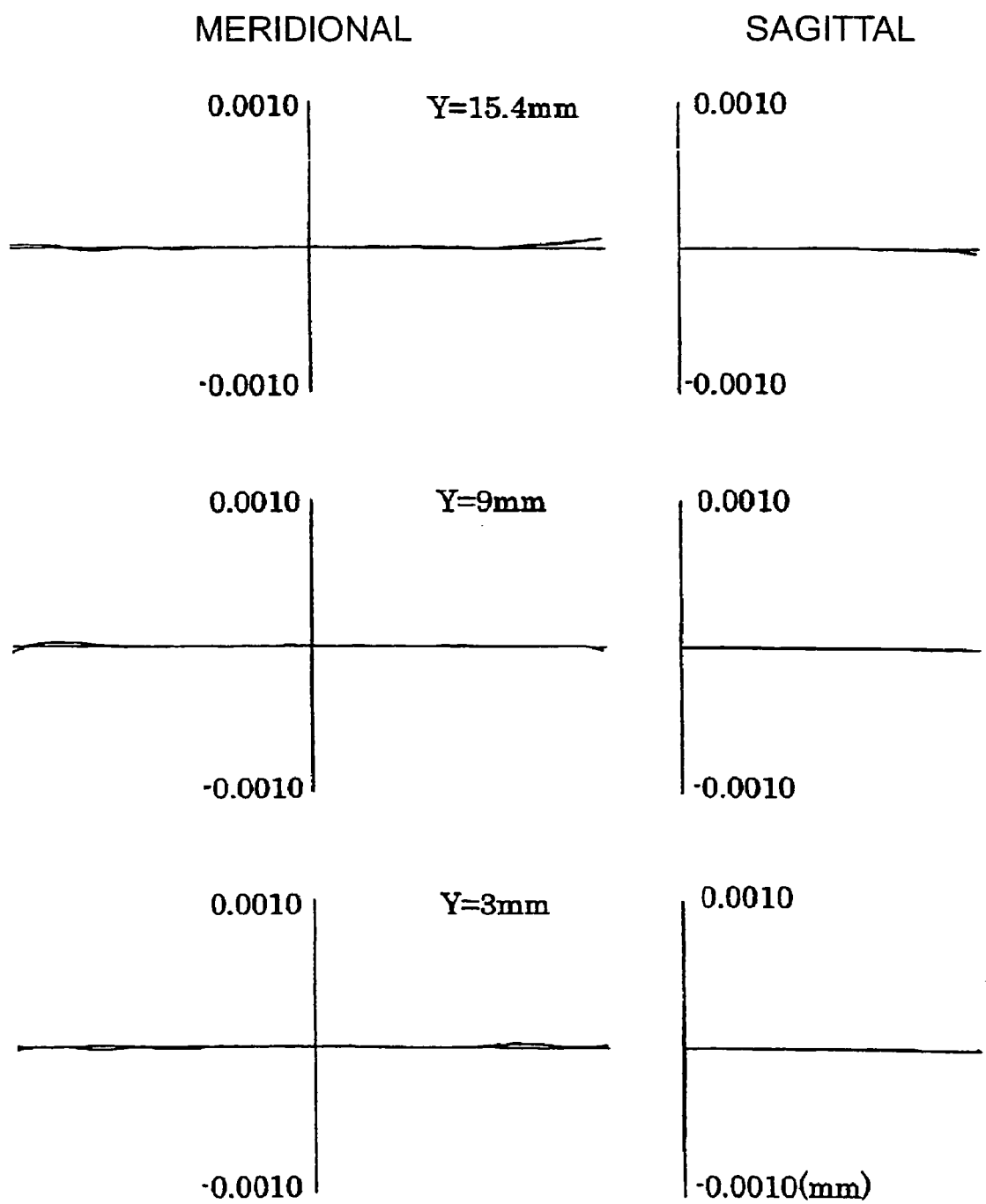
FIG. 5 shows a lateral aberration in the first example.

FIG. 5 is a diagram that shows the lateral aberrations in the first example. In the aberration diagram, Y denotes image height. As is apparent from the aberration diagram of FIG. 5, in the first example, the aberrations are well corrected with respect to the excimer laser beam having a wavelength of 193.306 nm in spite of the fact that a very large image-side numerical aperture (NA=1.5) and a relatively large effective exposure region ER (26 mm×5 mm) are secured.

Second Example

Figure 6:
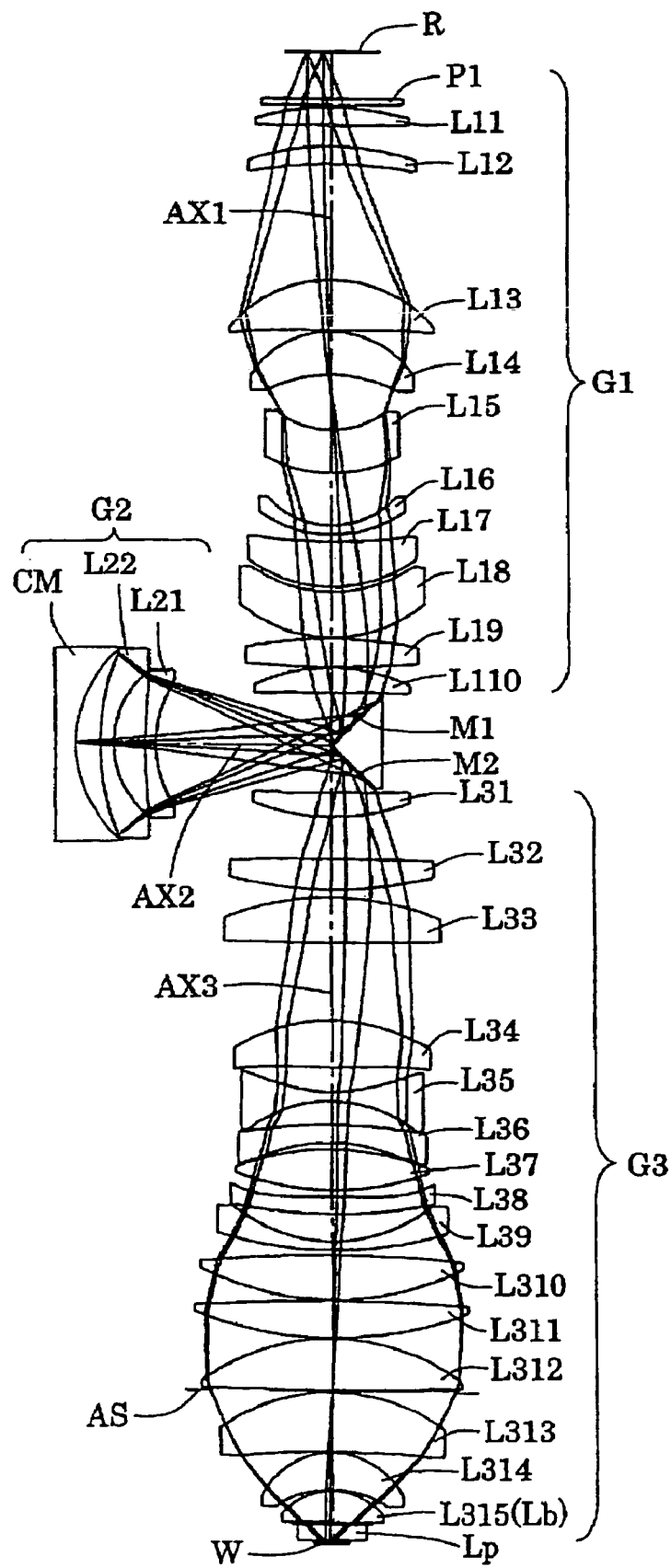
FIG. 6 shows a lens configuration of a projection optical system according to a second example of the embodiment.

FIG. 6 is a diagram that shows the lens configuration of a projection optical system related to the second example of this embodiment. Referring to FIG. 6, a first imaging optical system G1 in the projection optical system PL related to the second example comprises, in order from the reticle side, a plane-parallel plate P1, a positive meniscus lens L11 whose convex surface facing the reticle side, a positive meniscus lens L12 whose convex surface facing the reticle side, a positive meniscus lens L13 whose aspherical surface facing the wafer side, a positive meniscus lens L14 whose convex surface facing the reticle side, a negative meniscus lens L15 whose concave surface facing the reticle side, a negative meniscus lens L16 whose concave surface facing the reticle side, a positive meniscus lens L17 whose aspherical-shaped concave surface facing the reticle side, a positive meniscus lens L18 whose concave surface facing the reticle side, a double-convex lens L19 whose aspherical-shaped convex surface facing the wafer side, and a positive meniscus lens L110 whose aspherical-shaped concave surface facing the wafer side.

A second imaging optical system G2 comprises, in order from the reticle side (i.e. the entrance side) along the forward optical travel path, a negative meniscus lens L21 whose aspherical-shaped concave surface facing the reticle side, a negative meniscus lens L22 whose concave surface facing the reticle side, and a concave reflecting mirror CM whose concave surface facing the reticle side. A third imaging optical system G3 comprises, in order from the reticle side, a positive meniscus lens L31 whose concave surface facing the reticle side, a double-convex lens L32, a double-convex lens L33, a positive lens L34 whose aspherical surface facing the wafer side, a double-concave lens L35 whose aspherical-shaped concave surface facing the reticle side, a negative meniscus lens L36 whose aspherical-shaped concave surface facing the wafer side, a double-convex lens L37, a lens L38 whose aspherical surface facing the reticle side, a negative meniscus lens L39 whose aspherical-shaped concave surface facing the reticle side, a double-convex lens L310, a double-convex lens L311, a double-convex lens L312, an aperture stop AS, a positive meniscus lens L313 whose aspherical-shaped concave surface facing the wafer side, a positive meniscus lens L314 whose aspherical-shaped concave surface facing the wafer side, a plane-convex lens L315 whose plane facing the wafer side (a boundary lens Lb), and plane-parallel plate Lp.

In the second example, in the same manner as in the first example, a liquid Lm having a refractive index of 1.64 with respect to an ArF excimer laser beam (wavelength λ=193.306 nm), which is the light to be used (exposure light), is filled in an optical path between the boundary lens Lb and the plane-parallel plate Lp and an optical path between the plane-parallel plate Lp and the wafer W. It is possible to use glycerol ($CH_2[OH]CH[OH]CH_2[OH]$), heptane ($C_7H_{16}$) and the like as the liquid of this kind. In the second example, however, unlike the first example, the plane-convex lens L315 as the boundary lens Lb and the plane-parallel plate Lp are made of magnesium oxide (MgO) having a refractive index of 2.1 with respect to the light to be used, and the plane-parallel plate P1 in the first imaging optical system G1 is made of calcium oxide (CaO) having a refractive index of 2.7 with respect to the light to be used, and other light-transmitting members are made of silica ($SiO_2$) having a refractive index of 1.5603261 with respect to the light to be used. Table 2 gives the values of parameters of the projection optical system PL related to the second example.

TABLE (2)

(Main parameters)

$\lambda$ = 193.306 nm
$\beta$ = ¼
NA = 1.5
B = 15.4 mm
A = 3 mm
LX = 26 mm
LY = 5 mm (Parameters of optical members)

| Surface No. | r | d | n | Optical member |
|---|---|---|---|---|
|  | (Reticle surface) | 61.488045 |  |  |
| 1 | ∞ | 8.000000 | 2.7 | (P1) |
| 2 | ∞ | 3.000000 |  |  |
| 3 | 343.72875 | 22.736495 | 1.5603261 | (L11) |
| 4 | 11320.51072 | 27.609647 |  |  |
| 5 | 315.84611 | 22.906622 | 1.5603261 | (L12) |
| 6 | 519.35674 | 152.758756 |  |  |
| 7 | 166.25201 | 67.148030 | 1.5603261 | (L13) |
| 8* | −100000.00000 | 1.803406 |  |  |
| 9 | 122.90686 | 56.899748 | 1.5603261 | (L14) |
| 10 | 176.71063 | 72.456273 |  |  |
| 11 | −112.24882 | 57.183077 | 1.5603261 | (L15) |
| 12 | −177.64807 | 69.574199 |  |  |
| 13 | −109.24072 | 12.000000 | 1.5603261 | (L16) |
| 14 | −160.05421 | 8.713899 |  |  |
| 15* | −1319.76614 | 60.000000 | 1.5603261 | (L17) |
| 16 | −179.95005 | 6.186466 |  |  |
| 17 | −184.59624 | 60.000000 | 1.5603261 | (L18) |
| 18 | −181.38305 | 1.000000 |  |  |
| 19 | 522.39321 | 37.296564 | 1.5603261 | (L19) |
| 20* | −1237.27157 | 1.000000 |  |  |
| 21 | 226.65110 | 32.704191 | 1.5603261 | (L110) |
| 22* | 3443.76334 | 69.000000 |  |  |
| 23 | ∞ | −225.248400 |  | (M1) |
| 24* | 135.27205 | −12.500000 | 1.5603261 | (L21) |
| 25 | 763.23196 | −40.860891 |  |  |
| 26 | 123.71776 | −18.000000 | 1.5603261 | (L22) |
| 27 | 308.39695 | −33.707290 |  |  |
| 28 | 166.36433 | 33.707290 |  | (CM) |
| 29 | 308.39694 | 18.000000 | 1.5603261 | (L22) |
| 30 | 123.71776 | 40.860891 |  |  |
| 31 | 763.23196 | 12.500000 | 1.5603261 | (L21) |

TABLE (2)-continued

| 32* | 135.27205 | 225.248400 |  |  |
| 33 | ∞ | −64.048895 |  | (M2) |
| 34 | 3037.95158 | −31.291024 | 1.5603261 | (L31) |
| 35 | 283.28735 | −55.219198 |  |  |
| 36 | −4310.65810 | −39.964911 | 1.5603261 | (L32) |
| 37 | 529.81361 | −10.823066 |  |  |
| 38 | −357.26988 | −60.000000 | 1.5603261 | (L33) |
| 39 | 5041.57763 | −103.073057 |  |  |
| 40 | −234.74259 | −60.000000 | 1.5603261 | (L34) |
| 41* | 2000.00000 | −32.118738 |  |  |
| 42* | 203.78344 | −12.000000 | 1.5603261 | (L35) |
| 43 | −174.01269 | −30.859539 |  |  |
| 44 | −677.34580 | −23.155082 | 1.5603261 | (L36) |
| 45* | −186.83312 | −9.024762 |  |  |
| 46 | −340.71202 | −53.167176 | 1.5603261 | (L37) |
| 47 | 347.29465 | −9.020543 |  |  |
| 48* | ∞ | −22.523866 | 1.5603261 | (L38) |
| 49 | 620.09458 | −35.869134 |  |  |
| 50* | 203.91268 | −12.000000 | 1.5603261 | (L39) |
| 51 | 479.50254 | −5.422099 |  |  |
| 52 | −1616.06413 | −57.359057 | 1.5603261 | (L310) |
| 53 | 381.69065 | −1.221176 |  |  |
| 54 | −2670.87945 | −46.904209 | 1.5603261 | (L311) |
| 55 | 498.65890 | −1.000000 |  |  |
| 56 | −280.67485 | −66.851585 | 1.5603261 | (L312) |
| 57 | 4288.89930 | −1.000000 |  |  |
| 58 | ∞ | −1.000000 |  | (AS) |
| 59 | −242.42469 | −78.543309 | 1.5603261 | (L313) |
| 60* | −4109.30758 | −1.000000 |  |  |
| 61 | −103.81625 | −48.013323 | 1.5603261 | (L314) |
| 62* | −179.28408 | −1.000000 |  |  |
| 63 | −87.34389 | −39.922826 | 2.1 | (L315:Lb) |
| 64 | ∞ | −3.000000 | 1.64 | (Lm) |
| 65 | ∞ | −20.000000 | 2.1 | (Lp) |
| 66 | ∞ | −3.000000 | 1.64 | (Lm) |
|  | (Wafer surface) |  |  |  |

(Data of aspherical surfaces)

Surface #8

$\kappa = 0$
$C_4 = -2.38700 \times 10^{-9}$   $C_6 = 2.19848 \times 10^{-12}$
$C_8 = -1.06625 \times 10^{-16}$   $C_{10} = 3.79339 \times 10^{-24}$
$C_{12} = 3.05491 \times 10^{-25}$   $C_{14} = -1.40049 \times 10^{-29}$
$C_{16} = 2.07573 \times 10^{-34}$ Surface #15

$\kappa = 0$
$C_4 = -3.22668 \times 10^{-8}$   $C_6 = 1.90212 \times 10^{-13}$
$C_8 = -4.94924 \times 10^{-17}$   $C_{10} = 2.00126 \times 10^{-21}$
$C_{12} = -1.00360 \times 10^{-25}$   $C_{14} = 5.70267 \times 10^{-30}$
$C_{16} = -1.64436 \times 10^{-34}$ Surface #20

$\kappa = 0$
$C_4 = 7.78221 \times 10^{-9}$   $C_6 = -2.84918 \times 10^{-13}$
$C_8 = -7.27759 \times 10^{-18}$   $C_{10} = 2.72700 \times 10^{-22}$
$C_{12} = -1.19289 \times 10^{-26}$   $C_{14} = 5.92797 \times 10^{-31}$
$C_{16} = -1.03550 \times 10^{-35}$ Surface #22

$\kappa = 0$
$C_4 = -8.17419 \times 10^{-10}$   $C_6 = 4.07134 \times 10^{-13}$
$C_8 = 2.20418 \times 10^{-18}$   $C_{10} = -6.81433 \times 10^{-22}$
$C_{12} = 3.76576 \times 10^{-26}$   $C_{14} = -1.34115 \times 10^{-30}$
$C_{16} = 2.31166 \times 10^{-35}$ Surface #24 and surface #32 (the identical surface)

$\kappa = 0$
$C_4 = -9.44616 \times 10^{-8}$   $C_6 = -4.87959 \times 10^{-13}$
$C_8 = -1.31681 \times 10^{-16}$   $C_{10} = -4.35400 \times 10^{-21}$
$C_{12} = 4.33387 \times 10^{-24}$   $C_{14} = -7.03794 \times 10^{-28}$
$C_{16} = 4.83506 \times 10^{-32}$ Surface #41

$\kappa = 0$
$C_4 = -3.74782 \times 10^{-8}$   $C_6 = 1.18364 \times 10^{-12}$
$C_8 = -5.09800 \times 10^{-17}$   $C_{10} = 1.01796 \times 10^{-21}$ TABLE (2)-continued $C_{12} = -1.96390 \times 10^{-26}$     $C_{14} = -4.49365 \times 10^{-31}$
$C_{16} = 2.91126 \times 10^{-35}$ Surface #42

$\kappa = 0$
$C_4 = -5.94775 \times 10^{-8}$     $C_6 = 1.58659 \times 10^{-12}$
$C_8 = -1.59483 \times 10^{-16}$     $C_{10} = 9.50762 \times 10^{-21}$
$C_{12} = -3.26529 \times 10^{-25}$     $C_{14} = 5.41917 \times 10^{-30}$
$C_{16} = -1.81319 \times 10^{-35}$ Surface #45

$\kappa = 0$
$C_4 = 7.05058 \times 10^{-8}$     $C_6 = -4.46468 \times 10^{-13}$
$C_8 = 4.69144 \times 10^{-17}$     $C_{10} = -3.15707 \times 10^{-21}$
$C_{12} = 1.81100 \times 10^{-25}$     $C_{14} = -4.72547 \times 10^{-30}$
$C_{16} = -2.22284 \times 10^{-35}$ Surface #48

$\kappa = 0$
$C_4 = 4.26237 \times 10^{-8}$     $C_6 = 6.77863 \times 10^{-13}$
$C_8 = 3.83997 \times 10^{-17}$     $C_{10} = 6.09548 \times 10^{-22}$
$C_{12} = -7.33821 \times 10^{-26}$     $C_{14} = 6.91048 \times 10^{-30}$
$C_{16} = -4.01591 \times 10^{-34}$ Surface #50

$\kappa = 0$
$C_4 = 1.36637 \times 10^{-8}$     $C_6 = -6.02782 \times 10^{-13}$
$C_8 = 1.47586 \times 10^{-17}$     $C_{10} = -4.85443 \times 10^{-22}$
$C_{12} = -7.16685 \times 10^{-27}$     $C_{14} = 6.60114 \times 10^{-32}$
$C_{16} = 3.92846 \times 10^{-35}$ Surface #60

$\kappa = 0$
$C_4 = -2.75070 \times 10^{-8}$     $C_6 = 1.72882 \times 10^{-12}$
$C_8 = -8.71586 \times 10^{-17}$     $C_{10} = 3.77295 \times 10^{-22}$
$C_{12} = 3.87257 \times 10^{-26}$     $C_{14} = 1.18131 \times 10^{-29}$
$C_{16} = -1.40804 \times 10^{-33}$     $C_{18} = 6.18364 \times 10^{-38}$
$C_{20} = -1.06817 \times 10^{-42}$ Surface #62

$\kappa = 0$
$C_4 = -1.29877 \times 10^{-7}$     $C_6 = -1.63482 \times 10^{-11}$
$C_8 = 5.14480 \times 10^{-16}$     $C_{10} = -2.06381 \times 10^{-19}$
$C_{12} = 1.18222 \times 10^{-24}$     $C_{14} = -7.07065 \times 10^{-29}$
$C_{16} = -1.26067 \times 10^{-30}$     $C_{18} = 2.97954 \times 10^{-34}$
$C_{20} = -2.90634 \times 10^{-38}$ (Values corresponding to condition expressions)

Yi = 15.4 mm
Fb = 130.222 mm
(1) Yi/Fb = 0.118

Figure 7:
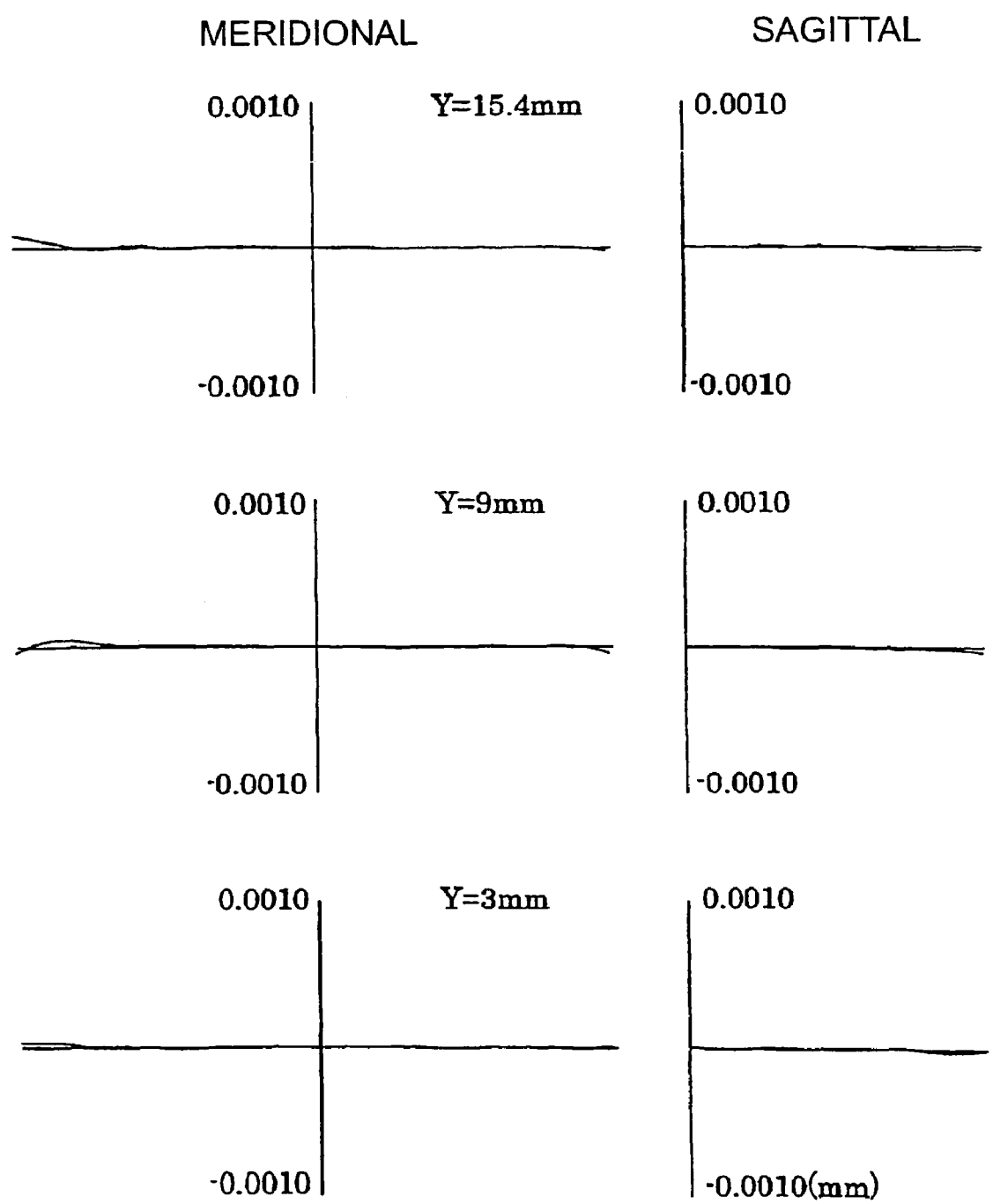
FIG. 7 shows a lateral aberration in the second example.

FIG. 7 is a diagram that shows the lateral aberrations in the first example. In the aberration diagram, Y denotes image height. As is apparent from the aberration diagram of FIG. 7, also in the second example as with the first example, the aberrations are well corrected with respect to the excimer laser beam having a wavelength of 193.306 nm in spite of the fact that a very large image-side numerical aperture (NA=1.5) and a relatively large effective exposure region ER (26 mm×5 mm) are secured.

In this manner, in each of the examples, for the ArF excimer laser beam having a wavelength of 193.306 nm, a large numerical image-side aperture of 1.5 can be secured and an effective exposure region (a static exposure region) ER having a rectangular shape of 26 mm×5 mm can be secured. It is possible to scan and expose a circuit pattern in an exposure region having a rectangular shape of 26 mm×33 mm, for example, with a high resolution.

Also, in each of the examples, the plane-parallel plate Lp is disposed in the optical path between the boundary lens Lb and the wafer W so that the plane-parallel plate Lp can be inserted into the optical path and retracted therefrom. Therefore, even when the liquid Lm is contaminated with a photoresist and the like applied to the wafer W, due to the operation of the plane-parallel plate Lp replaceably interposed between the boundary lens (in general, an optical member having substantially no refractive power) Lb and the wafer W, it is possible to effectively prevent the contamination of the image-side optical surface of the boundary lens Lb by a contaminated liquid Lm.

Incidentally, in the first example the plane-parallel plate Lp is made of calcium oxide and in the second example the plane-parallel plate Lp is made of magnesium oxide. However, without being limited to them, the plane-parallel plate Lp may be made of appropriate optical materials, such as fluorite ($CaF_2$) and silica. In order to achieve a high numerical aperture, however, it is preferred that the plane-parallel plate Lp be made of an optical material having a refractive index higher than the relevant image-side numerical aperture. In order to avoid large-diameter designs of optical members which the projection optical system comprises, it is preferred that the plane-parallel plate Lp be made of an optical material having a refractive index higher than the adjoining liquid Lm.

In the first example, the boundary lens Lb is made of magnesium oxide that is a crystalline material belonging to the cubic system and the plane-parallel plate Lp is made of calcium oxide also belonging to the cubic system. And the intrinsic birefringence of the magnesium oxide forming the boundary lens Lb is cancelled out with the intrinsic birefringence of the calcium oxide forming the plane-parallel plate Lp, whereby the effect of the intrinsic birefringence thereof is reduced. On the other hand, in the second example, the boundary lens Lb and the plane-parallel plate Lp are made of magnesium oxide and the plane-parallel plate P1 is made of calcium oxide. And the intrinsic birefringence of the magnesium oxide forming the boundary lens Lb and the plane-parallel plate Lp is cancelled out with the intrinsic birefringence of the calcium oxide forming the plane-parallel plate P1, whereby the effect of the intrinsic birefringence thereof is reduced.

In general, in a liquid immersion type projection optical system, a boundary lens is made of crystals belonging to the cubic (isometric) system (for example, magnesium oxide or calcium oxide) and the intrinsic birefringence of crystals forming a boundary lens is cancelled out with the intrinsic birefringence of a crystal optical element (an optically transparent member different from the boundary lens), where the effect of the intrinsic birefringence thereof can be reduced. In this case, it is preferred that by use of what is called a clocking technique, the crystal optical element be set so that the first crystal axis coincides substantially with an optical axis of the projection optical system, the boundary lens be set so that the second crystal axis thereof coincides substantially with an optical axis of the projection optical system, and furthermore the orientation of a crystal axis of the crystal optical element different from the first crystal axis and the orientation of a crystal axis of the boundary lens different from the second crystal axis be set so as to reduce the effect of the intrinsic birefringence that crystals belonging to the cubic system have.

Like fluorite, calcium oxide and magnesium oxide are crystalline materials of the isometric crystal system (the cubic system) and it is possible to cancel out the effect of the intrinsic birefringence by using clocking techniques similar to the one in the case of fluorite. The clocking techniques in the case of fluorite will be briefly described below. In the first clocking technique, an optical axis of a pair of fluorite lenses and a crystal axis [111] thereof (or a crystal axis that is optically equivalent to this crystal axis [111]) are arranged to coincide with each other, and the pair of fluorite lenses are arranged to be relatively rotated by approximately 60 degrees around the optical axis.

In the second clocking technique, an optical axis of a pair of fluorite lenses and a crystal axis [100] thereof (or a crystal axis that is optically equivalent to this crystal axis [100]) are arranged to coincide with each other, and the pair of fluorite lenses are arranged relatively to be rotated by approximately 45 degrees around the optical axis. In the third clocking technique, an optical axis of a pair of fluorite lenses and a crystal axis [110] thereof (or a crystal axis that is optically equivalent to this crystal axis [110]) are arranged to coincide with each other, and the pair of fluorite lenses are arranged to be relatively rotated by approximately 90 degrees around the optical axis. Incidentally, for details of a technique for reducing the effect of the intrinsic birefringence of fluorite by appropriately setting the orientation relationship of crystal axes of a pair of fluorite lenses, International Publication No. WO 2003/007045 (or U.S. Patent Laid-Open No. US 2003/0053036A), for example, may be referred to.

It is preferred that the thickness of the boundary lens along the optical axis and the thickness of the crystal optical element along the optical axis be designed so as to reduce the effect of the intrinsic birefringence retained by crystals belonging to the cubic system. The reason is as follows. That is, as described above, for example, calcium oxide and magnesium oxide have different signs and absolute amounts of intrinsic birefringence and, therefore, in order to compensate for the effect of intrinsic birefringence by the cancel effect due to combining calcium oxide and magnesium oxide, it is preferred that the thickness of the optical element made of calcium oxide and the thickness of the optical element made of magnesium oxide be designed so as to be virtually proportional to, respectively, the inverse number of the value of intrinsic birefringence of calcium oxide and the inverse number of the value of intrinsic birefringence of magnesium.

Incidentally, although in each of the above-described examples the preset invention is applied to catadioptric projection optical systems, the application of the present invention is not limited to them. The preset invention can also be applied to reflection type projection optical systems. However, as shown in each of the examples, in a catadioptric projection optical system provided with at least one concave reflecting mirror, color aberrations are well corrected by the operation of the concave reflecting mirror, for example, and field curvature can be well corrected by meeting the Petzval condition easily. In addition, it is possible to reduce the size of optical systems.

Incidentally, in a projection optical system constituted by thrice imaging optical systems as in each of the above-described examples, it is preferred that the following condition expression (3) be satisfied. In the condition expression (3), MA is the imaging magnification of the whole projection optical system and M3 is the imaging magnification of the third imaging optical system G3.

$$0.5 < |M3/MA| < 1 \quad (3)$$

When the condition expression (3) is satisfied, the angle range of light rays that become incident on the reflecting coatings of the first plane reflecting mirror M1 and the second plane reflecting mirror M2 is held to being small and by extension, a decrease in the imaging performance due to phase changes before and after reflection can be held to being small.

Specifically, in the first example, the imaging magnification MA of the whole projection optical system is ¼ and the imaging magnification M3 of the third imaging optical system G3 is 0.204. Thus the condition expression (3) is satisfied. On the other hand, in the second example, the imaging magnification MA of the whole projection optical system is ¼ and the imaging magnification M3 of the third imaging optical system G3 is 0.212. Thus the condition expression (3) is satisfied.

Figure 8:
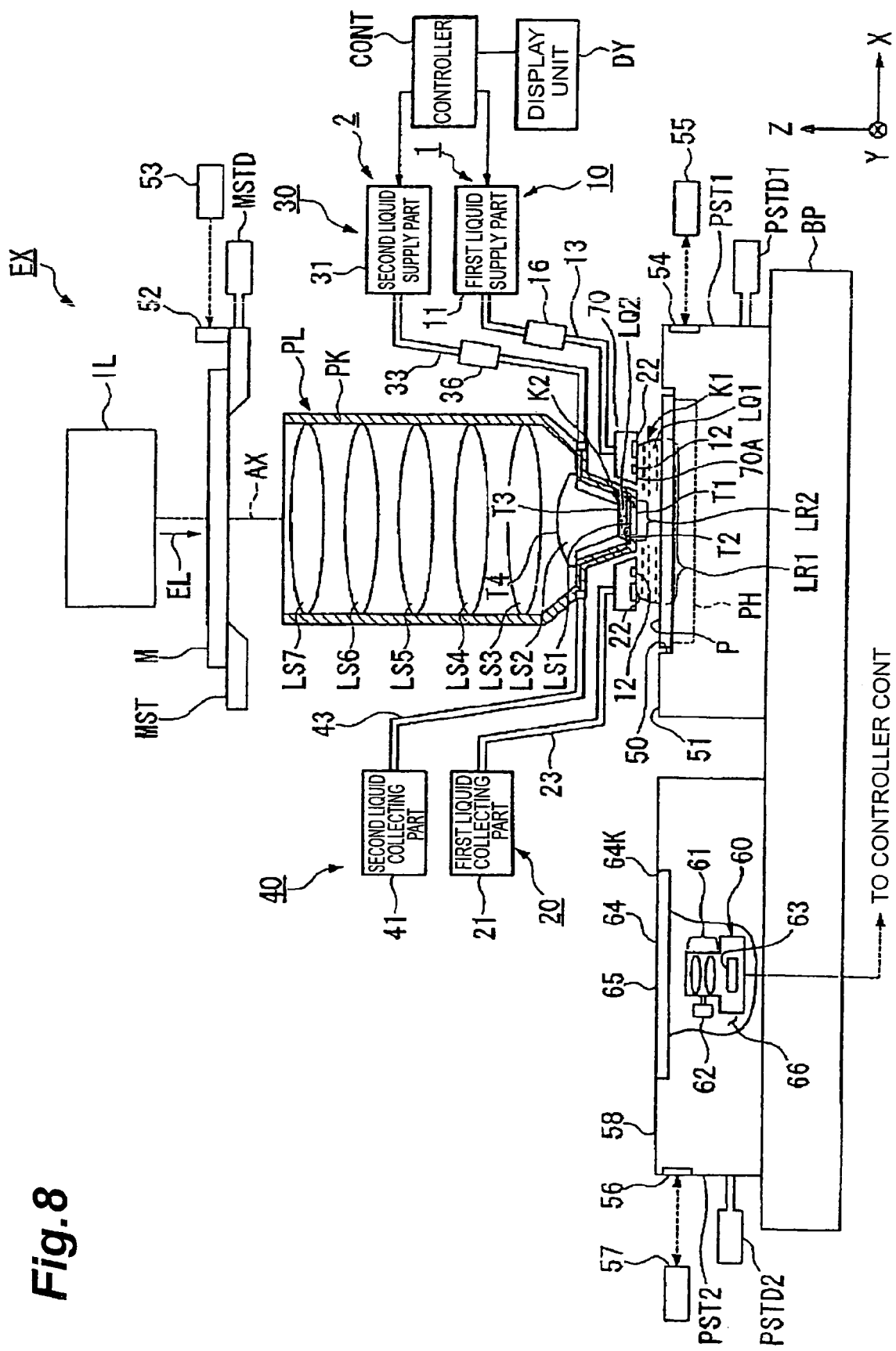
FIG. 8 shows a schematic diagram illustrating an exposure apparatus EX according to a second embodiment of the invention.

Next, the second embodiment of the exposure apparatus of the present invention will be described by referring to the drawings. FIG. 8 is a schematic configuration diagram of the exposure apparatus EX related to the second embodiment. In FIG. 8, the exposure apparatus EX is provided with a mask stage MST that is movable and that is supporting a mask M, a substrate stage PST1 that has a substrate holder PH holding a substrate P and is movable with the substrate P on the substrate holder PH, a measurement stage PST2 that holds measuring instruments performing measurements related to exposure process and is movable independently of the substrate stage PST1, an illumination optical system IL that illuminates the mask M supported by the mask stage MST with exposure light, a projection optical system PL that projects an image of a pattern of the mask M illuminated with the exposure light EL on the substrate P supported by the substrate stage PST1 to effect exposure, and a controller CONT that performs the overall control of operations of the whole exposure apparatus EX. A display unit DY that displays information concerning exposure process is connected to the controller CONT.

The exposure apparatus EX of this embodiment is an immersion exposure apparatus to which the liquid immersion method is applied in order to improve resolution by substantially shortening the exposure wavelength of the exposure light and in order to substantially increase the depth of focus. This exposure apparatus EX is provided with a first immersion mechanism 1 that forms a first liquid immersion region LR1 by filling an region between a bottom surface T1 of a first optical element LS1, which is the nearest to the image plane of the projection optical system PL among a plurality of optical elements LS1 to LS7 that constitute the projection optical system PL, and the substrate P with a first liquid LQ1. The first immersion mechanism 1 is provided with a first liquid supply mechanism 10 that supplies the first liquid LQ1 to the region between the bottom surface T1 of the first optical element LS1 and the substrate P, and a first liquid collecting mechanism 20 that collects the first liquid LQ1 supplied by the first liquid supply mechanism 10. Operations of the first immersion mechanism 1 are controlled by the controller CONT.

A nozzle member 70 that constitutes part of the first immersion mechanism 1 is disposed in the vicinity of the image plane side of the projection optical system PL, specifically, in the vicinity of the optical element LS1 at an end of the projection optical system PL on the image plane side. The nozzle member 70 is an annular member provided so as to surround the periphery of a tip portion of the projection optical system PL above the substrate P (substrate stage PST).

The exposure apparatus EX is also provided with a second immersion mechanism 2 that forms a second liquid immersion region LR2 by filling an region between the first optical element LS1 and the second optical element LS2, which is nearest to the image plane of the projection optical system PL second to the first optical element LS1, with a second liquid LQ2. The second optical element LS2 is disposed above the first optical element LS1, and a top surface T2 of the first optical element LS1 is disposed so as to be opposed to a bottom surface T3 of the second optical element LS2. The second immersion mechanism 2 is provided with a second liquid supply mechanism 30 that supplies the second liquid LQ2 to the region between the first optical element LS1 and the second optical element LS2, and a second liquid collecting mechanism 40 that collects the second liquid LQ2 supplied by the second liquid supply mechanism 30. Operations of the second immersion mechanism 2 are controlled by the controller CONT.

The exposure apparatus EX in this embodiment adopts a local liquid immersion method by which a first liquid immersion region LR1 is locally formed on part of the region above the substrate P. The exposure apparatus EX locally forms also a second liquid immersion region LR2 on part of the region above the top surface T2 of the first optical element LS1. At least while transferring a pattern image of the mask MT on the substrate P, the exposure apparatus EX forms the first liquid immersion region LR1 by filling the region between the first optical element LS1 and the substrate P disposed on the image plane side of the first optical element LS1 with the first liquid LQ1 by using the first immersion mechanism 1 and also forms the second liquid immersion region LR2 by filling the region between the first optical element LS1 and the second optical element LS2 with the second liquid LQ2 by using the second immersion mechanism 2.

The measurement stage PST2 is provided with a monitoring apparatus 60 that enables the condition of each of the first liquid immersion region LR1 and the second liquid immersion region LR2 to be observed. The monitoring apparatus 60 is provided in the interior of the measurement stage PST2.

In this embodiment, a description will be given by taking as an example a case where a scanning exposure apparatus (what is called a scanning stepper) that exposes a pattern formed on the mask M while synchronously moving the mask M and the substrate P in mutually different directions (reverse directions) in the scanning direction is used as the exposure apparatus EX. In the following description, the synchronous moving direction (scanning direction) of the mask M on the substrate P and the substrate P within a horizontal plane is called the X-axis direction, the direction orthogonal to the X-axis direction within the horizontal plane is called the Y-axis direction (the non-scanning direction), and the direction that is perpendicular to the X-axis and Y-axis directions and coincides with the optical axis AX of the projection optical system PL is called the Z-axis direction. The rotation (inclination) directions around the X-axis, Y-axis and Z-axis are respectively called the θX, θY and θZ directions. Incidentally, the term "substrate" used here includes a semiconductor wafer to which a resist is applied and the term "mask" used here includes a reticle on which a device pattern to be projected on the substrate in a reduced manner is formed.

The illumination optical system IL has an exposure light source that emits the exposure light EL, an optical integrator that makes the illuminance of the exposure light EL emitted from the exposure light source uniform, a condenser lens that converges the exposure light EL from the optical integrator, a relay lens system, a field stop that sets the illuminated region on the mask M by the exposure light EL and the like. For example, emission lines of ultraviolet region emitted from a mercury lamp, for example (g-line, h-line, i-line), far-ultraviolet light (DUV light), such as KrF excimer laser beam (wavelength: 248 nm), vacuum ultraviolet light (VUV light), such as ArF excimer laser beam (wavelength: 193 nm) and $F_2$ laser beam (wavelength: 157 nm), etc. are used as the exposure light EL emitted from the exposure light source. In this embodiment, the ArF excimer laser beam is used.

In this embodiment, liquids having a high refractive index, for example, liquids having a refractive index of not less than 1.6 are used as the first liquid LQ1 supplied from the first liquid supply mechanism 10 and the second liquid LQ2 supplied from the second liquid supply mechanism 30. In this embodiment, the first liquid LQ1 and the second liquid LQ2 are the same liquid. For example, glycerol ($CH_2[OH]CH[OH]CH_2[OH]$) and heptane ($C_7H_{16}$) can be used as such liquids having a high refractive index. Furthermore, water containing $H^+$, $Cs^-$, $K^+$, $Cl^-$, $SO_4^{2-}$ or $PO_4^{2-}$, water mixed with fine particles of oxide aluminum, isopropanol, hexane, decane, etc. can also be used.

The mask stage MST is movable while holding the mask M and capable of two-dimensional movement and microrotation in the θZ direction within a plane perpendicular to the optical axis AX of the projection optical system PL, i.e., within the XY plane. The mask stage MST is driven by a mask stage driving mechanism MSTD that is constructed so as to include a linear motor and the like. The mask stage driving mechanism MSTD is controlled by the controller CONT. A moving mirror 52 is provided on the mask stage MST. A laser interferometer 53 is provided in a position opposed to the moving mirror 52. The position of the mask M on the mask stage MS in the two-dimensional direction and the rotation angle thereof are measured in real time by the laser interferometer 53 and measurement results are output to the controller CONT. On the basis of the measurement results of the laser interferometer 53 the controller CONT drives the mask stage driving mechanism MSTD, thereby performing the positioning of the mask M supported by the mask stage MST.

The projection optical system PL projects an image of a pattern of the mask M on the substrate P to effect exposure with a prescribed projection magnification β. The projection optical system PL is constituted by a plurality of optical elements LS1 to LS7 including the first optical element LS1 provided at a tip portion on the substrate P side and these plurality of optical elements LS1 to LS7 are supported by a lens barrel PK. In this embodiment, the projection optical system PL is a reduction system with a projection magnification β of ¼, ⅕ or ⅛, for example. Incidentally, the projection optical system PL may also be either of an equal-magnification system or an enlarging system. The exposure light EL emitted from the illumination optical system IL becomes incident on the projection optical system PL from the object plane side, passes through the multiple optical elements LS7 to LS1, is then emitted from the image face side of the projection optical system PL, and reaches the substrate P. Specifically, after passing through each of the multiple optical elements LS7 to LS3, the exposure light EL passes through a prescribed region of a top surface T4 of the second optical element LS2, passes through a prescribed region of a bottom surface T3 thereof and then becomes incident on the second liquid immersion region LR2. The exposure light EL that has passed through the second liquid immersion region LR2 passes through a prescribed region of a top surface T2 of the first optical element LS1, then passes through a bottom surface T1 thereof, becomes incident on the first liquid immersion region LR1 and then reaches the substrate P.

In this embodiment, the first optical element LS1 is a plane-parallel plate having no refractive power, which is capable of transmitting the exposure light EL, where the bottom surface T1 and top surface T2 of the first optical element are substantially parallel. On the other hand, the second optical element LS2 has refractive power (the lens operation). Incidentally, the first optical element LS1 may have refractive power (the lens operation).

The substrate stage PST1 has a substrate holder PH that holds the substrate P, and is provided so as to be movable on a base BP on the image plane side of the projection optical system PL. The substrate stage PST is driven by the substrate stage driving mechanism PSTD1. The substrate stage driving mechanism PSTD1 is controlled by the controller CONT. The substrate stage driving mechanism PSTD1 is constructed so as to include a linear motor, voice coil motor, and the like for example, and can move the substrate stage PST1 in each of the X-axis, Y-axis and Z-axis directions and the θX, θY and θZ directions. Therefore, the substrate stage PST1 can move the substrate P held by the substrate holder PH in each of the X-axis, Y-axis and Z-axis directions and the θX, θY and θZ directions.

A moving mirror 54 is provided on a side surface of the substrate stage PST1. A laser interferometer 55 is provided in a position opposed to the moving mirror 54. The position of the substrate P on the substrate stage PST1 in the two-dimensional direction and the rotation angle thereof are measured in real time by the laser interferometer 55 and measurement results are output to the controller CONT. On the basis of the measurement results of the laser interferometer 55, the controller CONT drives the substrate stage PST1 via the substrate stage driving mechanism PSTD1 within a two-dimensional coordinate system defined by the laser interferometer 55, thereby performing the positioning of the substrate P supported by the substrate stage PST1 in the X-axis and Z-axis directions.

The exposure apparatus EX has a focus detection system of an oblique incidence method that detects surface position information on the surface of the substrate P as disclosed in Japanese Patent Laid-Open No. Hei 8-37149, for example. The focus detection system detects the position (focus position) on the surface of the substrate P in the Z-axis direction relative to the image plane of the projection optical system PL. Detecting each focus position at a multiple of points on the surface of the substrate P makes it possible for the focus detection system also to obtain the position of the substrate P in the inclination angle. On the basis of inspection results of the focus detection system, the controller CONT drives the substrate stage PST1 via a substrate stage driving mechanism PSTD1 and controls the position (focus position) of the substrate P in the Z-axis direction and position thereof in the θX and θY directions, whereby the controller CONT aligns the surface (exposure surface) of the substrate P with an image plane formed by the auto focus method and the auto leveling method via the projection optical system PL and the liquid LQ.

Incidentally, the focus detection system may detect the surface position of the substrate P from outside the liquid immersion region LR1, instead of going through the medium of the liquid LQ1 or may be used in combination with a system that detects the surface position of the substrate P via the liquid LQ1.

A hollow portion 50 is provided on the substrate stage PST1 and the substrate holder PH is disposed within the hollow portion 50. A top surface 51 of the substrate stage PST1 except the hollow portion 50 is a flat surface so as to have almost the same height as the surface of the substrate P held by the substrate holder PH (be almost flush therewith). The top surface 51 of the substrate stage PST1 has liquid-repellent properties against the first liquid LQ1. Because the top surface 51 almost flush with the surface of the substrate P is provided around the substrate P, the first liquid LQ1 is held on the image plane side of the projection optical system PL, and the first liquid immersion region LR1 can be well formed even when the immersion exposure of a peripheral edge portion of the surface of the substrate P is performed.

The measurement stage PST2 is equipped with various measuring instruments for performing measurement related to exposure process, and provided so as to be movable on the base BP on the image plane side of the projection optical system PL. The measurement stage PST2 is driven by a measurement stage driving mechanism PSTD2. The measurement stage driving mechanism PSTD2 is controlled by the controller CONT. And the controller CONT can move each of the substrate stage PST1 and the measurement stage PST2 independently of each other via each of the stage driving mechanism PSTD1, PSTD2 on the base BP. The measurement stage driving mechanism PSTD2 has a configuration equal to that of the substrate stage driving mechanism PSTD1, and in the same way as with the substrate stage PST1, the measurement stage PST2 is movable in each of the X-axis, Y-axis and Z-axis directions and the θX, θY and θZ directions by use of the measurement stage driving mechanism PSTD2. A moving mirror 56 for a laser interferometer 57 is provided on a side surface of the measurement stage PST2. The position of the measurement stage PST2 in the two-dimensional direction and the rotation angle thereof are measured in real time by the laser interferometer 57 and on the basis of measurement results of the laser interferometer 57, the controller CONT controls the position of the measurement stage PST2.

An opening portion 64K is formed on the measurement stage PST2 disposed on the image plane side of the projection optical system PL, and a transparent member 64 is disposed in the opening portion 64K. The transparent member 64 is made of a glass plate, for example. A top surface 65 of the transparent member 64 is a flat surface. Also a top surface 58 of the measurement stage PST2 other than the opening portion 64K is also a flat surface. And the top surface 58 of the measurement stage PST2 and the top surface 65 of the transparent member 64 disposed in the opening portion 64K are provided so as to have almost the same height (be almost flush with each other), and the top surface 58 of the measurement stage PST2 is configured so as to include the top surface 65 of the transparent member 64. Incidentally, it is preferred that the top surface 58 of the measurement stage PST2 and the top surface 65 of the transparent member 64 have liquid-repellent properties against the liquid LQ.

The top surface 58 of the measurement stage PST2 including the top surface 65 of the transparent member 64 is provided in a position side by side with respect to the top surface 51 of the substrate stage PST1, and the top surface 51 of the substrate stage PST1 and the top surface 58 of the measurement stage PST2 are provided so as to have almost the same height position.

An internal space 66 that connects to the opening portion 64K is formed in the measurement stage PST2. And the monitoring apparatus 60 is disposed in the internal space 66 of the measurement stage PST2. The monitoring apparatus 60 is provided with an optical system 61 disposed below the transparent member 64 and an image-pickup element 63 constituted by a CCD and the like. The image-pickup element 63 can obtain optical images (images) of the liquids (LQ1, LQ2), the optical elements (LS1, LS2) and the like via the transparent member 64 and the optical system 61. The image-pickup element 63 convert obtained images into electrical signals and outputs the signals (image information) to the controller CONT. The monitoring apparatus 60 has an adjustment mechanism 62 capable of adjusting the focal position of the optical system 61. The monitoring apparatus 60 has a visual field that enables the whole of the first liquid immersion region LR1 and the second liquid immersion region LR2 to be observed.

Incidentally, although the whole of the monitoring apparatus 60 may be disposed in the interior of the measurement stage PST2, for example, part of the plurality of optical elements constituting the optical system 61, the image-pickup element 63 and the like may be disposed outside the measurement stage PST2. The configuration may be such that the adjustment mechanism 62 is omitted.

Incidentally, in order to increase the numerical aperture in the liquid immersion method, it is conceivable to use liquids having a high refractive index, for example, liquids having a refractive index of not less than 1.6. In this case, it is preferred that part of the lenses of the projection optical system (particularly, a lens close to the image plane) be made of a material having a high refractive index in order to reduce the size (diameter) of the projection optical system. For example, it is preferred that among the optical elements of the projection optical system, the second optical element LS2 in contact with the second liquid LQ2 be made of at least one of the materials of CaO (calcium oxide) and MgO (magnesium oxide). This enables a high numerical aperture to be realized with a feasible size. For example, even when an ArF excimer laser (wavelength: 193 nm) is used, it is possible to realize a high numerical aperture of the order of 1.5 or higher.

In the above-described second embodiment, the first optical element LS1 disposed nearest to the image plane side (the substrate P side) is a plane-parallel plate having no refractive power. However, when this first optical element LS1 has refractive power, it is preferred that this first optical element LS1 disposed nearest to the image plane side be made of at least one of CaO and MgO.

That is, it is preferred that the projection optical system that projects an image of an object on the substrate via the liquid in the liquid immersion region formed on the image plane side be provided with the first optical element that is disposed nearest to the image plane side and made of at least one of the materials of CAO (calcium oxide) and MgO (magnesium oxide). Also, it is preferred that the projection optical system that projects an image of an object on the substrate via the liquid in the liquid immersion region formed on the image plane side be provided with the first optical element that is disposed nearest to the image plane side and the second optical element that is disposed adjacent to the object side of the first optical element, and that at least one of the first optical element and the second optical element be made of at least one of the materials of CAO (calcium oxide) and MgO (magnesium oxide). For example, one of the first optical element LS1 and the second optical element LS2 can be made of CAO (calcium oxide) and the other can be made of MgO (magnesium oxide).

Incidentally, when the first optical element LS1 has refractive power, it is not always necessary that the optical path space between the first optical element LS1 and the second optical element LS2 be filled with the second liquid Q2.

Although CAO (calcium oxide) and MgO (magnesium oxide) have intrinsic birefringence at the wavelength of the exposure light EL, the signs of the intrinsic birefringence are opposite to each other in CAO (calcium oxide) and MgO (magnesium oxide). Therefore, it is preferred that when one of the optical elements in the vicinity of the image plane side (the substrate P side) of the projection optical system is made of CAO or MgO, an optical element in the vicinity of this optical element be made of MgO or CAO correspondingly and that the thickness of these optical elements along the optical axis be designed so as to reduce the effect of intrinsic birefringence. In this connection, it is preferred that these optical elements have the same crystal orientation. It is not always necessary that the optical element made of CaO and the optical element made of MgO be adjacent to each other.

For example, when a case where the second optical element LS2 is made of MgO (or CAO) and the third optical element LS3 is made of CAO (or MgO) is considered, it is preferred that the thickness of the second optical element LS2 along the optical axis and the thickness of the third optical element LS3 along the optical axis be designed so as to be virtually proportional to the reverse numbers of the values of intrinsic birefringence of CAO and MgO. In the above-described case, the first optical element LS1 nearest to the image plane side (the substrate P side) can be made of silica glass.

When the first optical element LS1 has refractive power, the first optical element LS1 may be made of MgO (or CAO), the second optical element LS2 may be made of CAO (or MgO), and the thickness of the first optical element LS1 along the optical axis and the thickness of the second optical element LS2 along the optical axis may be designed so as to be virtually proportional to the reverse numbers of the values of intrinsic birefringence of CAO and MgO.

When an optical element is made of CAO (calcium oxide), it is preferred that an antireflection coating containing MgO (magnesium oxide) be formed on an optical surface of this optical element. When an optical element is made of MgO (magnesium oxide), it is preferred that an antireflection coating containing CAO (calcium oxide) be formed on an optical surface of this optical element.

In the above-described first embodiment and second embodiment, it is possible to use a crystalline material in which another material is added to CAO (calcium oxide) or a crystalline material in which another material is added to MgO (magnesium oxide). Furthermore, it is also possible to use barium fluoride, strontium oxide, barium oxide or crystalline materials that contain these substances as a main component. Although in the above-described first embodiment and second embodiment, CAO (calcium oxide) and MgO (magnesium oxide) are used as crystalline materials of oxides, it is also possible to use rock crystal ($SiO_2$ crystal) and sapphire ($\alpha$ alumina crystal).

Incidentally, when the liquid immersion method is used as described above, the numerical aperture NA of the projection optical system may become 0.9 to 1.3. When the numerical aperture NA of the projection optical system increases like this, in randomly polarized light that has hitherto been used as exposure light, imaging quality may sometimes worsen due to the polarization effect and, therefore, it is preferred to use polarized illumination. In this case, it is advisable to perform linearly polarized illumination aligned in the longitudinal direction of a line pattern of a line and space pattern, thereby to ensure that an s-polarized light component (a TE-polarized light component), i.e., a diffraction light component of a polarization direction along the longitudinal direction of the line pattern is emitted a lot from a pattern of the mask (reticle). When the region between the projection optical system PL and a resist applied to the surface of the substrate P is filled with a liquid, the transmittance on the resist surface, an improvement of which the s-polarized light component (the TE-polarized light component) contributes to in contrast, increases compared to a case where the region between the projection optical system PL and a resist applied to the surface of the substrate P is filled with air (gas). Therefore, high imaging quality can be obtained even when the numerical aperture NA of the projection optical system exceeds 1.0.

Also, it is more effective to combine a phase shift mask, the oblique incident illumination method (particularly, the dipole illumination method) aligned in the longitudinal direction of a line pattern as disclosed in Japanese Patent Laid-Open No. 6-188169 and the like. Particularly, a combination of the linearly polarized illumination method and the dipole illumination method is effective when the cycle direction of line and space patterns is limited to a prescribed single direction and when hole patterns are present in dense condition along a prescribed single direction. For example, when a halftone type phase shift mask with a transmittance of 6% (pattern with a half pitch of 45 nm or so) is illuminated by a combination of the linearly polarized illumination method and the dipole illumination method. Then it is possible to increase the depth of focus (DOF) by 150 nm or so compared to a case where randomly polarized light is used, when the illumination σ defined by a circumscribed circle of two light beams forming the dipole on the pupil plane of the illumination system is 0.95, the radius of each of the light beams on the pupil plane is 0.125σ, and the numerical aperture NA of the projection optical system PL is 1.2.

A combination of linearly polarized illumination and the small-σ illumination method (an illumination method in which the σ-value indicating the ratio of the numerical aperture of the illumination system NAi to the numerical aperture of the projection optical system NAp is not more than 0.4) is also effective.

For example, in a case where fine line and space patterns (for example, lines and spaces of 25 to 50 nm or so) are exposed on the substrate P by using a projection optical system PL with a reducing magnification of ¼ or so with an ArF excimer laser beam as the exposure light, the mask M acts as a polarizing plate due to the waveguide effect depending on the configuration of the mask M (for example, the fineness of the patterns and the thickness of chromium) and more diffraction light of the s-polarized light component (TE-polarized light component) than the diffraction light of p-polarized light component (TM-polarized light component) is emitted from the mask M. In this case, it is preferred that the above-described linearly diffracted illumination be used. However, even when the mask M is illuminated with randomly polarized light, high resolving performance can be obtained even in a case where the numerical aperture NA of the projection optical system PL is as large as 0.9 to 1.3.

When ultrafine line and space patterns on the mask M are exposed on the substrate P, there is a possibility that due to the wire grid effect, the amount of the p-polarized light component (TM-polarized light component) becomes larger than the amount of the s-polarized light component (TE-polarized component). However, for example, in a case where fine line and space patterns that are larger than 25 nm are exposed on the substrate P by using a projection optical system PL with a reducing magnification of ¼ or so with an ArF excimer laser beam as the exposure light, more diffraction light of the s-polarized light component (TE-polarized light component) than the diffraction light of p-polarized light component (TM-polarized light component) is emitted from the mask M. Therefore, high resolving performance can be obtained even in a case where the numerical aperture NA of the projection optical system PL is as large as 0.9 to 1.3.

Furthermore, in addition to the linearly polarized illumination (s-polarized illumination) aligned in the longitudinal direction of the line pattern of the mask (reticle), as disclosed in Japanese Patent Laid-Open No. 6-53120, a combination of the polarized illumination method, in which linear polarization is performed in the tangential (circumferential) direction of a circle with the optical axis serving as the center, and the oblique incident illumination method is also effective. Particularly, not only in a case where the patterns of the mask (reticle) are line patterns extending in a prescribed single direction, but also in a case where the patterns of the mask (reticle) are line patterns extending in a plurality of different mixed directions (line and space patterns having different cycle directions are mixed), by a combination of the polarized illumination method, in which linear polarization is performed in the tangential direction of a circle with the optical axis serving as the center, and the annular illumination method, which is described in Japanese Patent Laid-Open No. 6-53120, it is possible to obtain high imaging quality even when the numerical aperture NA of the projection optical system is large. For example, when the phase shift mask of half tone type with 6% transmittance (patterns with a half pitch of 63 am or so) is illuminated by a combination of the polarized illumination method, in which linear polarization is performed in the tangential (circumferential) direction of a circle with the optical axis serving as the center and the annular illumination method (annular ratio: 3/4), then it is possible to increase the depth of focus (DOF) by 250 nm or so compared to a case where randomly polarized light is used when the illumination σ is 0.95 and the numerical aperture NA of the projection optical system PL is 1.00, and it is possible to increase the depth of focus (DOF) by 100 nm or so if the numerical aperture NA of the projection optical system is 1.2 in case of patterns with a half pitch of 55 nm or so.

Furthermore, in addition to the above-described various illumination methods, it is also effective to apply the progressive focal-point exposure method, which is disclosed, for example, in Japanese Patent Laid-Open No. 4-277612 and Japanese Patent Laid-Open No. 2001-345245 or the multiple wavelength exposure method, from which the same effect as the progressive focal point exposure method is obtained by using the exposure light with multiple wavelengths (for example, dual wavelengths).

In this embodiment, an optical element is attached to the tip of the projection optical system PL and by using this lens it becomes possible to adjust the optical characteristics, for example, aberrations (spherical aberration, coma aberration and the like) of the projection optical system PL. Incidentally, an optical plate used to adjust the optical characteristics of the projection optical system PL may also be used as the optical element attached to the tip of the projection optical system PL. Or alternatively, it is also possible to use a plane-parallel plate transmitting exposure light.

Incidentally, when the pressure between the optical element at the tip of the projection optical system PL and the substrate P generated by the flow of the liquid LQ is large, instead of making the optical element replaceable, the optical element can be firmly fixed so that the optical element is not moved by the pressure.

Incidentally, although in this embodiment the configuration is such that the region between the projection optical system PL and the substrate P is filled with the liquid LQ, the configuration may be such that, for example, the liquid LQ is filled, with a cover glass made of a plane-parallel plate attached to the surface of the substrate P.

Incidentally, as the substrate P of the above-described second example, not only a semiconductor wafer for the manufacturing of semiconductor devices, but also a glass substrate for display device, a ceramic wafer for thin-film magnetic head, or a mother plate (synthetic silica, silicon wafer) for a mask or a reticle used in exposure apparatus and the like are applied.

For the exposure apparatus EX, in addition to a scanning exposure apparatus (a scanning stepper) of the step and scan method that scans and exposes a pattern formed on the mask M while synchronously moving the mask M and the substrate P, it is possible to apply the present invention to a projection exposure apparatus (a stepper) of the step and repeat method that collectively exposes patterns of the mask M, with the mask M and the substrate P kept in a stationary state, and successively moves the substrate P in steps.

For the exposure apparatus, it is possible to apply the present invention to an exposure apparatus of a method that involves collectively exposing a reduced image of a first pattern on the substrate P, with the first pattern and the substrate P kept in an almost stationary state, by use of a projection optical system (for example, a dioptric projection optical system of a reducing magnification of ⅛ not including a reflecting element). In this case, it is also possible to apply the present invention to a collective exposure apparatus of the stitch method that further involves collectively exposing thereafter a reduced image of a second pattern on the substrate P, with the second pattern partially superposed on the first pattern and with the second pattern and the substrate P kept in an almost stationary state, by use of the projection optical system. For the exposure apparatus of the stitch method, it is also possible to apply the present invention to an exposure apparatus of the step and stitch method that involves transferring at least two patterns, which are partially superposed on the substrate P, and successively moving the substrate P.

The present invention can also be applied to the twin-stage type exposure apparatus, which is disclosed in Japanese Patent Laid-Open No. 10-163099, Japanese Patent Laid-Open No. 10-214783, Domestic re-publication of international application No. 2000-505958, etc. In the case of the twin-stage type exposure apparatus, at least part of the monitoring apparatus 60 may be provided in each of the two substrate stages supporting the substrates, or at least part of the monitoring apparatus 60 may also be provided in only one of the two substrate stages.

Although in the above-described embodiment, the description was given to the case where the present invention is applied to the exposure apparatus provided with the measurement stage and the substrate stage, it is also possible to apply the present invention to an exposure apparatus that is provided with only one substrate stage and is not provided with a measurement stage.

Although in the above-described embodiment, the exposure apparatus that locally fills a liquid in the region between the projection optical system PL and the substrate P is adopted, it is also possible to apply the present invention to an immersion exposure apparatus that moves a stage holding a substrate, which is an object of exposure, in a liquid tank, as disclosed in Japanese Patent Laid-Open No. 6-124873.

As for the type of the exposure apparatus, the present invention is not limited to an exposure apparatus EX for manufacturing semiconductor devices in which semiconductor device patterns are exposed on the substrate P, and can also be widely applied to exposure apparatus for manufacturing liquid-crystal display elements or displays, exposure apparatus for manufacturing thin-film magnetic heads, image-pickup elements (CCDs), reticles or masks and the like.

As described above, the exposure apparatus EX of the second embodiment is manufactured by assembling various kinds of subsystems including each of the components enumerated in the claims of the present application so that prescribed mechanical accuracies, electrical accuracies and optical accuracies are maintained. In order to maintain these various kinds of accuracies, before and after this assembling, adjustments for achieving optical accuracies are made for various kinds of optical systems, adjustments for achieving mechanical accuracies are made for various kinds of mechanical systems, and adjustments for achieving electrical accuracies are made for various kinds of electrical systems. The assembling process from each subsystem to the exposure apparatus includes mechanical connections, wiring connections of electric circuits, piping connections of barometric circuits and the like among each of the various kinds of subsystems. It is needless to say that before this assembling process from each subsystem to the exposure apparatus, there are individual assembling processes of each of the subsystems. When the assembling process from each subsystem to the exposure apparatus has been completed, overall adjustments are performed and various kinds of accuracies as the whole exposure apparatus are ensured. Incidentally, it is preferred that the manufacture of the exposure apparatus be performed in a clean room where temperature, cleanliness and the like are controlled.

In the exposure apparatus of the above-described embodiment, the reticle (mask) is illuminated by use of the illumination apparatus (the illumination step) and patterns formed on a mask for transferring are exposed on the photosensitive substrate by use of the projection optical system (the exposure step), whereby microdevices (semiconductor devices, image-pickup elements, liquid-crystal display elements, thin-film magnetic heads and the like) can be manufactured. With reference to the flowchart of FIG. 9, a description will be given below of an example of a technique for obtaining semiconductor devices as microdevices by forming prescribed circuit patterns on a wafer and the like as a photosensitive substrate by the exposure apparatus of this embodiment.

Figure 9:
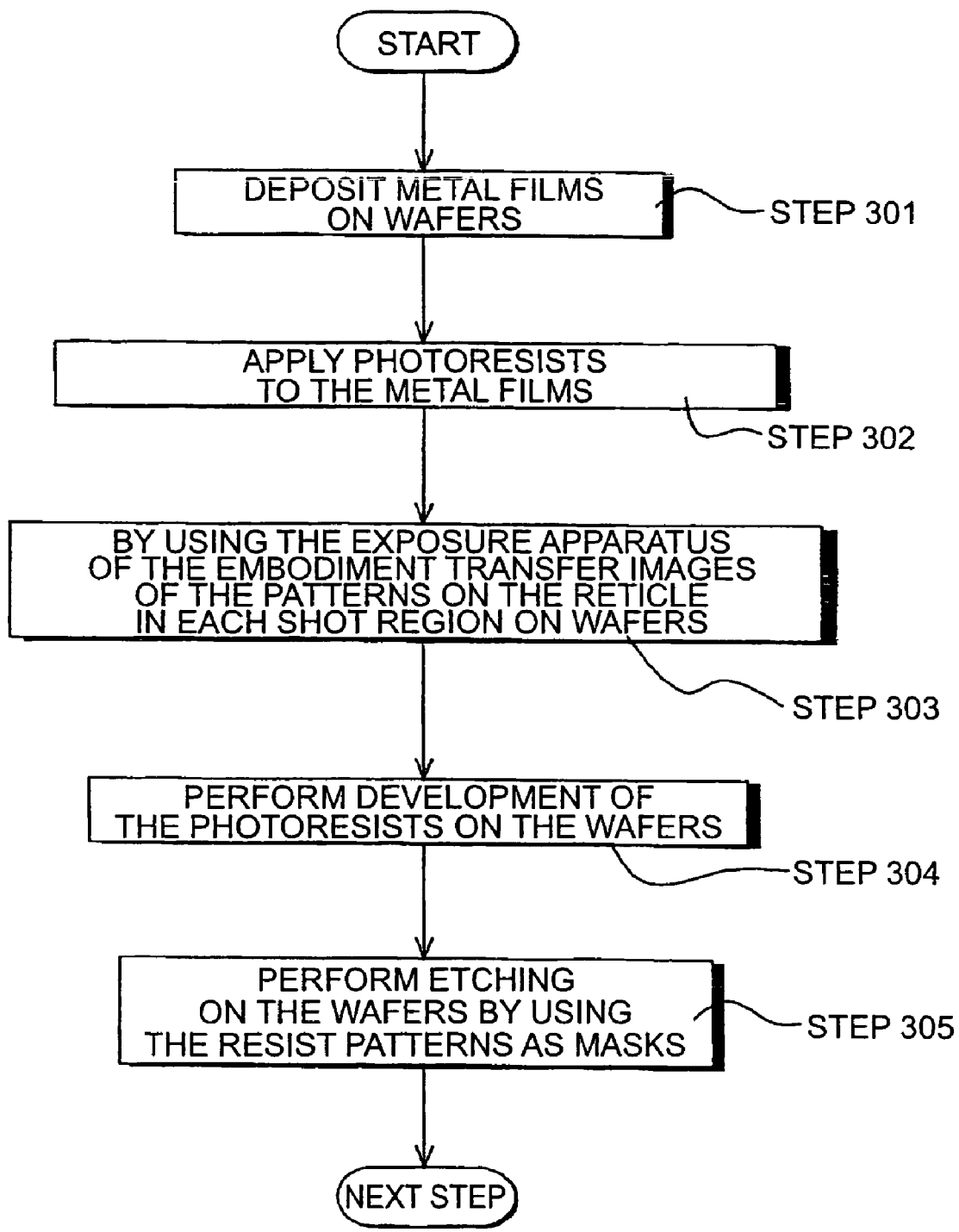
FIG. 9 shows a flow chart of an approach in obtaining a semiconductor device as a micro-device.

First, in Step 301 of FIG. 9, metal films are deposited on wafers of one lot. In Step 302, photoresists are applied to the metal films on the wafers of the one lot. After that, in Step 303, images of patterns on the mask are successively exposed and transferred in each shot region on the wafers of one lot by using the exposure apparatus of this embodiment via the projection optical system. After that, in Step 304, the development of the photoresists on the wafers of the one lot is performed. After that, in Step 305, etching is performed on the wafers of the one lot by using the resist patterns as the masks, whereby circuit patterns corresponding to the patterns on the masks are formed in each of the shot regions on each of the wafers.

After that, devices such as semiconductor devices are manufactured by performing the formation of circuit patterns of upper layers and the like. According to the above-described manufacturing method of semiconductor devices, it is possible to obtain semiconductor devices having very fine circuit patterns with good throughput. Incidentally, although in Step 301 to Step 305 metal is deposited on wafers, resists are applied to the metal films, and the steps of exposure, development and etching are then performed, needless to say, it is also possible to adopt a method which is such that oxide films of silicon are formed on the wafers prior to these steps and thereafter resists are applied to the oxide films of silicon, which is followed by the steps of exposure, development and etching.

Figure 10:
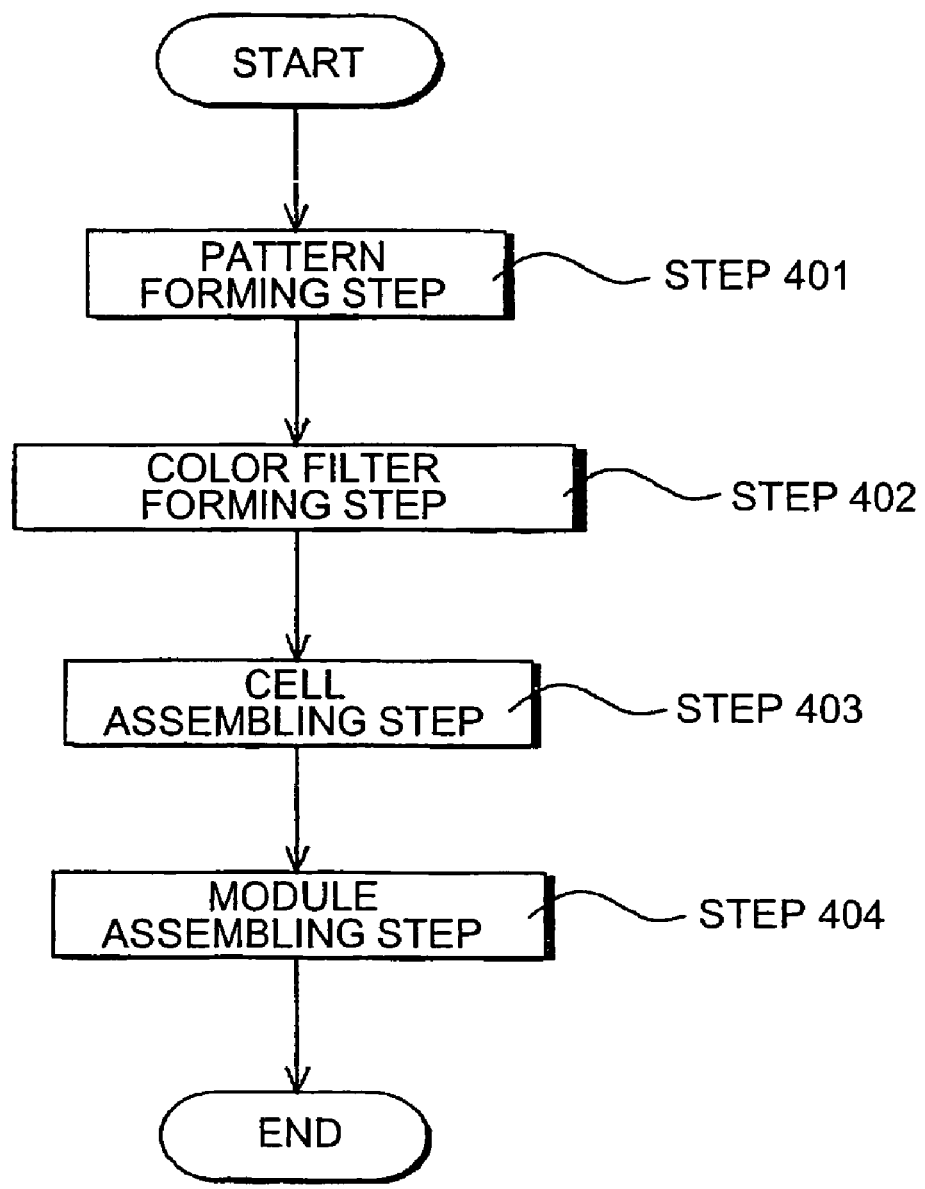
FIG. 10 shows a flow chart of an approach in obtaining a liquid crystal display element as a micro-device.

In the exposure apparatus of this embodiment, it is also possible to obtain a liquid-crystal display device as a microdevice by forming prescribed patterns (circuit patterns, electrode patterns and the like) on the plate (glass substrate). With reference to the flowchart of FIG. 10, an example of a procedure to be followed in this case will be described below. In FIG. 10, first in the pattern forming step 401, what is called the photolithography step is performed by use of the exposure apparatus of this embodiment. The photolithography step involves transferring and exposing patterns of the mask on a photosensitive substrate (a glass substrate to which a resist is applied and the like). In this photolithography step, prescribed patterns including a large number of electrodes and the like are formed on the photosensitive substrate. After that, the exposed substrate passes the steps, such as the development step, the etching step and the resist removing step, whereby prescribed patterns are formed on the substrate and the process proceeds to the following color filter forming step 402.

Next, in the color filter forming step 402, a color filter is formed in which a large number of sets of three dots corresponding to R (red), G (green) and B (blue) are arrayed in matrix arrangement or a plurality of sets of filters with three stripes of R, G and B are arrayed in a horizontal scanning direction. And after the color filter forming step 402, the cell assembling step 403 is performed. In the cell assembling step 403, a liquid-crystal panel (a liquid-crystal cell) is assembled by using the substrate having prescribed patterns obtained in the pattern forming step 401, the color filter obtained in the color filter forming step 402 and the like.

In the cell assembling step 403, liquid crystals are injected into a gap between, for example, the substrate having prescribed patterns obtained in the pattern forming step 401 and the color filter obtained in the color filter forming step 402, whereby a liquid-crystal panel (a liquid-crystal cell) is manufactured. After that, in the module assembling step 404, parts, such as an electric circuit for causing the assembled liquid-crystal panel (a liquid-crystal cell) to perform display operations and a backlight, are attached and a liquid-crystal device is completed. According to the above-described manufacturing method of liquid-crystal elements, it is possible to obtain a liquid-crystal element having very fine circuit patterns with good throughput.

Although an ArF excimer light source is used in the above-described embodiment, the kind of the light source is not limited to this, and it is also possible to use other appropriate light sources, such as an $F_2$ laser light source. Furthermore, although in the above-described embodiment the present invention is applied to the projection optical system to be mounted on the exposure apparatus, the application of the present invention is not limited to this and it is also possible to apply the present invention to other general projection optical systems.

In a projection optical system according to the above embodiments, liquid having a refractive index larger than 1.5 is interposed in an optical path between the boundary lens and the image plane (second surface), and the boundary lens is made of the optical material having a refractive index larger than 1.8 in association with the high refractive index of the liquid in contact with the surface of the boundary lens on the image side. As a result, the above embodiments can provide a projection optical system that has liquid interposed in the optical path to the image plane to achieve the large effective image-side numerical aperture larger than, for example, 1.4, while a relatively large effective imaging region can be secured.

Therefore, with the exposure apparatus and exposure method according to the embodiments, the fine pattern can be accurately projected to effect exposure through the high resolution projection optical system having an image-side numerical aperture larger than, for example, 1.4, while the relatively large effective imaging region is secured, and consequently, highly accurate and good micro-devices can be manufactured.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

The invention claimed is:

1. An imaging optical system which conjugates a first surface to a second surface, comprising:
a boundary lens that can be contacted with gas on a side of the first surface and that can be contacted with liquid on a side of the second surface,
wherein the liquid has a refractive index larger than 1.5, and a refractive index of gas in an optical path within the imaging optical system is 1,
wherein the boundary lens includes a positive refracting power and is made of an optical material including a refractive index larger than 1.7, and
wherein a condition $$0.11 < Yi/Fb < 0.15$$

is satisfied, where a focal length of the boundary lens is Fb and a maximum image height on the second surface in a case where the second surface is the image plane, or a maximum object height on the second surface in a case where the second surface is the object plane, is Yi.

2. The imaging optical system according to claim 1, wherein the boundary lens is made of an oxide crystalline material in a cubic system.

3. The imaging optical system according to claim 2, wherein the oxide crystalline material is selected from a crystalline material group consisting of CaO, a crystalline material containing CaO, MgO, and a crystalline material containing MgO.

4. The imaging optical system according to claim 2, wherein the boundary lens is disposed such that a crystal orientation <100> is substantially in parallel with an optical axis of the boundary lens.

5. The imaging optical system according to claim 4, wherein a numerical aperture of the imaging optical system on the second surface side exceeds 1.3.

6. The imaging optical system according to claim 4, wherein a reduced image of the first surface is formed on the second surface.

7. The imaging optical system according to claim 4, wherein a condition $$0.115 < Yi/Fb < 0.15$$

is satisfied.

8. The imaging optical system according to claim 4, wherein a condition $$0.115 < Yi/Fb < 0.14$$

is satisfied.

9. The imaging optical system according to claim 4, wherein the imaging optical system comprises:
a first imaging optical system of dioptric type disposed between the first surface and the second surface;
a second imaging optical system including at least one concave reflecting mirror, the second imaging optical system disposed between the first imaging optical system and the second surface; and
a third imaging optical system of dioptric type disposed between the second imaging optical system and the second surface; and in that
respective intermediate images are formed in optical paths between the first imaging optical system and the second imaging optical system and between the second imaging optical system and the third imaging optical system.

10. The imaging optical system according to claim 9, wherein a condition $$0.5 < |M3/MA| < 1$$

is satisfied, where an imaging magnification of the entirety of the imaging optical system is MA and an imaging magnification of the third imaging optical system is M3.

11. The imaging optical system according to claim 10, further comprising a first folding mirror disposed in an optical path between the first imaging optical system and the second imaging optical system; and
    a second folding mirror disposed in an optical path between the second imaging optical system and the third imaging optical system.

12. The imaging optical system according to claim 11, wherein the respective intermediate images are formed in an optical path of the first deflecting mirror on a side of the concave reflecting mirror and in an optical path of the second deflecting mirror on the side of the concave reflecting mirror.

13. The imaging optical system according to claim 4, wherein an image of the first surface is formed on the second surface based on an s-polarized illumination light.

14. The imaging optical system according to claim 13, wherein a line and space pattern is disposed on the first surface.

15. The imaging optical system according to claim 14, wherein the s-polarized illumination light is linearly polarized illumination aligned in a longitudinal direction of a line pattern of the line and space pattern.

16. The imaging optical system according to claim 13, wherein the first surface is illuminated with oblique incident illumination.

17. The imaging optical system according to claim 16, wherein the first surface is illuminated with annular illumination.

18. The imaging optical system according to claim 16, wherein the first surface is illuminated with dipole illumination.

19. A projection optical system has the imaging optical system according to claim 13, wherein the imaging optical system forms a reduced image of the first surface onto the second surface.

20. The imaging optical system according to claim 4, wherein the image of the first surface is formed on the second surface based on a circumferential linearly polarization light.

21. The imaging optical system according to claim 20, wherein a first line and space pattern and a second line and space pattern are disposed in the first surface, wherein a longitudinal direction of the first line and space pattern and a longitudinal direction of the second line and space pattern are different each other.

22. The imaging optical system according to claim 2, wherein the boundary lens is disposed such that a crystal orientation <111> is substantially in parallel with an optical axis of the boundary lens.

23. The optical system according to claim 1, wherein the liquid includes a refractive index of 1.6 or higher with respect to a wavelength used.

24. A projection optical system that projects a reduced image of a first surface onto a second surface, comprising:
    a boundary lens that can be contacted with gas on a side of the first surface and that can be contacted with liquid on a side of the second surface,
    wherein an optical path between the projection optical system and the second surface can be filled with the liquid having a refractive index larger than 1.5, and a refractive index of the gas in an optical path within the projection optical system is 1,
    wherein the boundary lens includes a positive refracting power and is made of an optical material including a refractive index larger than 1.8, and
    wherein a condition $$0.11 < Yi/Fb < 0.15$$

is satisfied, where a focal length of the boundary lens is Fb and a maximum image height on the second surface in a case where the second surface is the image plane, or a maximum object height on the second surface in a case where the second surface is the object plane, is Yi.

25. The projection optical system according to claim 24, wherein a condition $$0.115 < Yi/Fb < 0.15$$

is satisfied.

26. The projection optical system according to claim 24, a condition $$0.115 < Yi/Fb < 0.14$$

is satisfied.

27. The projection optical system according to claim 24, wherein the boundary lens is made of magnesium oxide.

28. The projection optical system according to claim 27, wherein the projection optical system includes at least one optically transparent member made of calcium oxide.

29. The projection optical system according to claim 28, wherein, starting sequentially from the first surface, first to third optically transparent members along a path of traveling light include at least one optically transparent member made of the calcium oxide.

30. The projection optical system according to claim 24, wherein the boundary lens is made of calcium oxide.

31. The projection optical system according to claim 30, wherein the projection optical system includes at least one optically transparent member made of magnesium oxide.

32. The projection optical system according to claim 24, wherein, starting sequentially from the second surface, first to third optically transparent members along a path of traveling light include at least one optically transparent member made of magnesium oxide and at least one optically transparent member made of calcium oxide, and wherein a condition $$0.05 < TC/TM < 0.43$$

is satisfied, where a sum of center thickness of the at least one optically transparent member made of the magnesium oxide is TM, and a sum of center thickness of the at least one optically transparent member made of the calcium oxide is TC.

33. The projection optical system according to claim 32, wherein one optically transparent member made of the magnesium oxide and one optically transparent member made of the calcium oxide constitute a united lens.

34. The projection optical system according to claim 24, further comprising an optical member including substantially no refracting power and disposed in an optical path between the boundary lens and the second surface.

35. The projection optical system according to claim 34, wherein the boundary lens is made of a crystalline material represented as $Mg_xCa_{1-x}O$ (0.8<x<0.9).

36. The projection optical system according to claim 34, wherein the optical member including substantially no refracting power includes a refractive index higher than adjacent liquid.

37. The projection optical system according to claim 36, wherein the optical member including substantially no refracting power is made of calcium oxide, magnesium oxide, fluorite, or silica.

38. The projection optical system according to claim 24, further comprising a crystal optical element made of a crystal belonging to a cubic system, and the boundary lens is made of a crystal belonging to a cubic system, wherein the crystal optical element is arranged so that a first crystal axis thereof substantially coincides with an optical axis of the projection optical system, the boundary lens is arranged so that a second crystal axis thereof substantially coincides with an optical axis of the projection optical system, and an orientation of a crystal axis of the crystal optical element different from the first crystal axis and an orientation of a crystal axis of the boundary lens different from the second crystal axis are arranged to reduce an effect of intrinsic birefringence retained by the crystal belonging to the cubic system.

39. The projection optical system according to claim 38, wherein the boundary lens is made of magnesium oxide or calcium oxide, and the crystal optical element is made of calcium oxide or magnesium oxide.

40. The projection optical system according to claim 38, wherein thickness of the boundary lens along an optical axis and thickness of the crystal optical element along the optical axis are arranged to reduce an effect of intrinsic birefringence retained by the crystal belonging to the cubic system.

41. The projection optical system according to claim 24, further comprising at least one concave reflecting mirror.

42. The projection optical system according to claim 41, comprising:

a first imaging optical system of dioptric type for forming a first intermediate image based on light from the first surface;

a second imaging optical system including the at least one concave reflecting mirror, the second imaging optical system being for forming a second intermediate image based on light from the first intermediate image;

a third imaging optical system of dioptric type for forming the reduced image onto the second surface based on light from the second intermediate image;

a first folding mirror disposed in an optical path between the first imaging optical system and the second imaging optical system; and a second folding mirror disposed in an optical path between the second imaging optical system and the third imaging optical system.

43. The projection optical system according to claim 42, wherein a condition $$0.5 < |M3/MA| < 1$$

is satisfied, where an imaging magnification of the entirety of the projection optical system is MA and an imaging magnification of the third imaging optical system is M3.

44. The optical system according to claim 24, wherein the liquid includes a refractive index of 1.6 or higher with respect to a wavelength used.

45. An exposure apparatus comprising a projection optical system according to claim 24 that exposes the substrate through liquid in an immersion region formed on the image-plane side of the projection optical system.

46. A device manufacturing method comprising:

exposing a predetermined pattern onto a photosensitive substrate using the exposure apparatus of claim 45; and processing the exposed photosensitive substrate into the device.

47. An exposure method, comprising exposing the substrate through liquid in an immersion region formed on the image-plane side of a projection optical system according to claim 24.

* * * * *